(12) United States Patent
Yoshii et al.

(10) Patent No.: US 9,886,047 B2
(45) Date of Patent: Feb. 6, 2018

(54) REFERENCE VOLTAGE GENERATION CIRCUIT INCLUDING RESISTOR ARRANGEMENTS

(71) Applicant: Rohm Co., Ltd., Kyoto (JP)

(72) Inventors: Yusuke Yoshii, Kyoto (JP); Yuki Inoue, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 88 days.

(21) Appl. No.: 15/138,854

(22) Filed: Apr. 26, 2016

(65) Prior Publication Data

US 2016/0320783 A1    Nov. 3, 2016

(30) Foreign Application Priority Data

May  1, 2015   (JP) .................. 2015-094233
May  1, 2015   (JP) .................. 2015-094234
May  1, 2015   (JP) .................. 2015-094235
May  1, 2015   (JP) .................. 2015-094237
Mar. 30, 2016  (JP) .................. 2016-067611

(51) Int. Cl.
  *G05F 1/575*  (2006.01)
  *G05F 3/30*   (2006.01)
  *H03K 5/24*   (2006.01)
  *H03F 3/45*   (2006.01)

(52) U.S. Cl.
  CPC .............. *G05F 1/575* (2013.01); *G05F 3/30* (2013.01); *H03F 3/45475* (2013.01); *H03K 5/24* (2013.01); *H03F 2203/45522* (2013.01); *H03F 2203/45534* (2013.01)

(58) Field of Classification Search
  CPC ... G05F 3/20; G05F 3/30; G05F 1/575; G05F 3/245
  See application file for complete search history.

(56) References Cited

U.S. PATENT DOCUMENTS

| | | | | |
|---|---|---|---|---|
| 5,852,360 A * | 12/1998 | Levinson | ................ | G05F 3/245 323/314 |
| 6,037,833 A * | 3/2000 | Ang | ................ | G01K 7/01 323/313 |
| 6,650,173 B1 * | 11/2003 | Khouri | .................. | G11C 5/147 327/538 |
| 7,994,849 B2 * | 8/2011 | Pan | .................. | G05F 3/30 327/539 |
| 8,026,756 B2 * | 9/2011 | Yuasa | ...................... | G05F 3/30 327/539 |
| 8,786,358 B2 * | 7/2014 | Endo | .................. | G05F 3/30 327/513 |

(Continued)

FOREIGN PATENT DOCUMENTS

JP    2011-232931    11/2011

*Primary Examiner* — Yusef Ahmed
(74) *Attorney, Agent, or Firm* — Fish & Richardson P.C.

(57) ABSTRACT

As one example of the invention disclosed herein, a reference voltage generation circuit has: a first reference voltage source generating a first reference voltage; a second reference voltage source generating a second reference voltage having a temperature response different from that of the first reference voltage; a first comparator comparing the first and second reference voltages to generate a first comparison signal; and a selector selectively outputting one of the first and second reference voltages as a reference voltage according to the first comparison signal.

6 Claims, 16 Drawing Sheets

(56) References Cited

U.S. PATENT DOCUMENTS

| | | | | |
|---|---|---|---|---|
| 8,947,067 B1* | 2/2015 | Zarei | G05F 3/30 | 323/313 |
| 2005/0276140 A1* | 12/2005 | Ogiwara | G03B 42/02 | 365/212 |
| 2006/0176043 A1* | 8/2006 | Makino | G05F 3/30 | 323/312 |
| 2007/0098042 A1* | 5/2007 | Choi | G01K 7/015 | 374/170 |
| 2007/0241736 A1* | 10/2007 | Ogiwara | G05F 3/30 | 323/313 |
| 2007/0247133 A1* | 10/2007 | Isobe | G11C 5/147 | 323/312 |
| 2007/0296392 A1* | 12/2007 | Chen | G05F 3/30 | 323/313 |
| 2008/0116965 A1* | 5/2008 | Ogiwara | G05F 3/30 | 327/543 |
| 2008/0315857 A1* | 12/2008 | Sugimura | G05F 3/24 | 323/316 |
| 2009/0039944 A1* | 2/2009 | Ogiwara | G05F 3/30 | 327/512 |
| 2009/0201067 A1* | 8/2009 | Haneda | G05F 3/30 | 327/306 |
| 2010/0164463 A1* | 7/2010 | Kojima | G11C 5/147 | 323/298 |
| 2011/0248688 A1* | 10/2011 | Iacob | G05F 1/575 | 323/234 |
| 2011/0316515 A1* | 12/2011 | Mitsuda | G05F 3/30 | 323/314 |
| 2012/0051157 A1* | 3/2012 | Nakanishi | G11C 5/147 | 365/189.09 |
| 2012/0057376 A1* | 3/2012 | Ito | H02M 3/155 | 363/21.17 |
| 2012/0119724 A1 | 5/2012 | Kikuchi | | |
| 2012/0249114 A1* | 10/2012 | Sako | G05F 1/561 | 323/312 |
| 2012/0262146 A1* | 10/2012 | Morita | G05F 3/30 | 323/313 |
| 2013/0241522 A1* | 9/2013 | Youssefi | G05F 3/30 | 323/313 |
| 2014/0159699 A1* | 6/2014 | Iguchi | G05F 3/30 | 323/313 |
| 2015/0102789 A1* | 4/2015 | Kobayashi | G05F 1/468 | 323/271 |
| 2015/0168969 A1* | 6/2015 | Shor | G06F 1/28 | 713/340 |
| 2016/0062382 A1* | 3/2016 | Nagakura | G05F 3/08 | 323/313 |
| 2016/0252920 A1* | 9/2016 | Chu | G05F 1/463 | 323/268 |
| 2017/0160145 A1* | 6/2017 | Chiang | G01K 7/16 | |

* cited by examiner

REFERENCE VOLTAGE GENERATION CIRCUIT INCLUDING RESISTOR ARRANGEMENTS

CROSS-REFERENCE TO RELATED APPLICATIONS

This application is based on the following Japanese Patent Applications, the contents of which are hereby incorporated by reference:
(1) JP-A-2015-94233 (filed on May 1, 2015)
(2) JP-A-2015-94234 (filed on May 1, 2015)
(3) JP-A-2015-94235 (filed on May 1, 2015)
(4) JP-A-2015-94237 (filed on May 1, 2015)
(5) JP-A-2016-67611 (filed on Mar. 30, 2016)

BACKGROUND OF THE INVENTION

1. Field of the Invention

The present invention relates to a reference voltage generation circuit and a regulator, and also relates to a semiconductor device in which those are integrated.

2. Description of Related Art

Today, semiconductor devices (so-called voltage reference ICs) that generate from an input voltage an output voltage that is hardly susceptible to variation in the supplied voltage or in temperature are used in various applications.

An example of conventional technology related to what has just been mentioned is seen in Japanese Patent Application Publication No. 2011-232931.

However, in attempts to enhance the precision of voltage reference ICs, there is still room for improvement.

SUMMARY OF THE INVENTION

To cope with the above-mentioned problem encountered by the present inventors, the present invention aims to provide a reference voltage generation circuit and a regulator with high output precision, and to provide a semiconductor device in which those are integrated.

According to one aspect of the present invention, a reference voltage generation circuit includes: a first reference voltage source that generates a first reference voltage; a second reference voltage source that generates a second reference voltage having a temperature response different from that of the first reference voltage; a first comparator that compares the first and second reference voltages with each other to generate a first comparison signal; and a selector that selectively outputs one of the first and second reference voltages as a reference voltage according to the first comparison signal (a first configuration).

According to another aspect of the present invention, a reference voltage generation circuit includes: an amplifier; a first resistor connected between an output terminal of the amplifier and a first input terminal of the amplifier; a second resistor connected between the output terminal of the amplifier and a second input terminal of the amplifier; a third resistor connected between the second input terminal of the amplifier and a ground terminal; a first diode connected between the first input terminal of the amplifier and the ground terminal; and a plurality of second diodes connected in parallel with each other between the second input terminal of the amplifier and the ground terminal. Here, one of the first and second resistors includes: a first resistor portion; a second resistor portion having a temperature response different from that of the first resistor portion, and a first trimming portion that adjusts the resistance values of the first and second resistor portions while keeping their composite resistance value constant (a second configuration).

According to yet another aspect of the present invention, a reference voltage generation circuit includes: an amplifier; a first resistor connected between an output terminal of the amplifier and a first input terminal of the amplifier; a second resistor connected between the output terminal of the amplifier and a second input terminal of the amplifier; a third resistor connected between the second input terminal of the amplifier and a ground terminal; a first diode connected between the first input terminal of the amplifier and the ground terminal; and a plurality of second diodes connected in parallel with each other between the second input terminal of the amplifier and the ground terminal. Here, one of the first and second resistors is composed of a combination of a polyresistor portion and a diffusion resistor portion (a third configuration).

According to still another aspect of the present invention, a regulator includes: an amplifier that outputs an amplified voltage so as to keep a feedback voltage and a reference voltage equal; a resistor ladder that generates the feedback voltage by dividing the amplified voltage; a first switch array that selects one of the endmost and middle nodes of a first resistor array included in the resistor ladder to connect the selected node to an output terminal of a constant voltage; a second switch array connected in parallel with a second resistor array included in the resistor ladder; and a decoder that controls the first and second switch arrays according to a trimming signal (a fourth configuration).

Accosting to a further aspect of the present invention, a semiconductor device includes a reference voltage generation circuit of any one of the first to third configuration described above or a regulator of the fourth configuration described above (a fifth configuration).

Other features, elements, steps, benefits, and characteristics of the present invention will become clear from the following description taken in conjunction with the accompanying drawings.

DETAILED DESCRIPTION OF PREFERRED EMBODIMENTS

Figure 1:
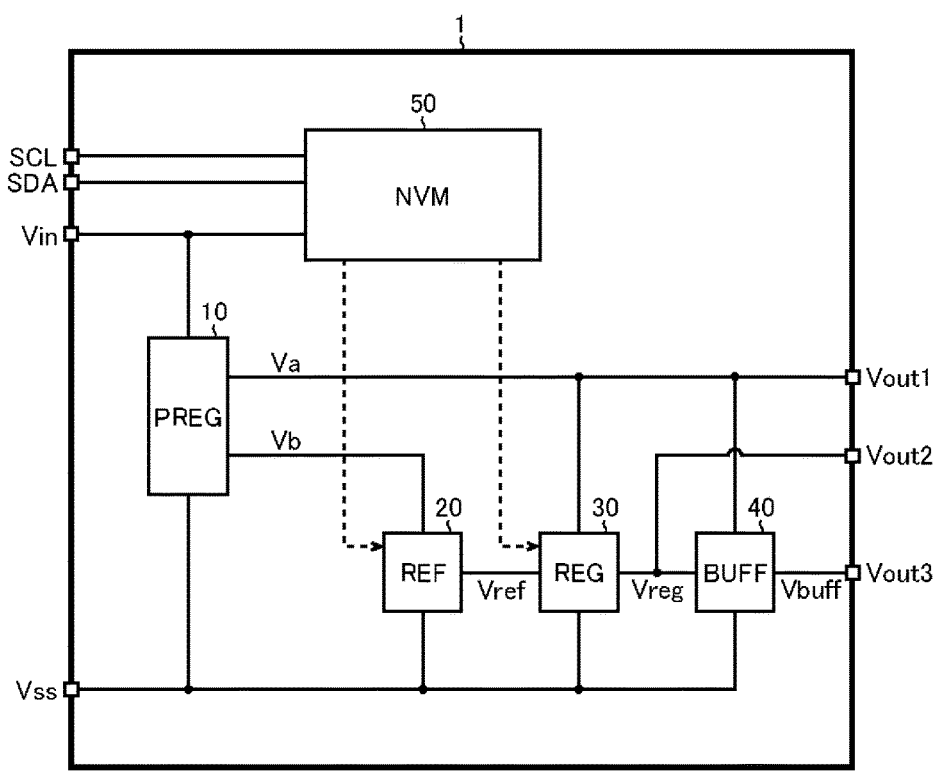
FIG. 1 is a block diagram showing an example of an overall configuration of a semiconductor device 1.

Semiconductor Device:

FIG. 1 is a block diagram showing an example of an overall configuration of a semiconductor device 1. The semiconductor device 1 of this configuration example is a voltage reference IC: it produces, from an input voltage Vin, output voltages Vout1 to Vout3 that are hardly susceptible to variation in the supplied voltage or variation in temperature, and outputs those output voltages to outside the semiconductor device 1. The semiconductor device 1 has integrated into it a pre-regulator (PREG) 10, a reference voltage generation circuit (REF) 20, a regulator (REG) 30, a buffer (BUFF) 40, and a non-volatile memory (NVM) 50. The output voltages Vout1 to Vout3 can be suitably used as reference voltages for comparators and operational amplifiers that are provided in subsequent stages.

The pre-regulator 10 is connected between an application terminal of the input voltage Vin and an application terminal of a ground voltage Vss, and produces, from the input voltage Vin, predetermined first and second internal supply voltages Va and Vb. The first internal supply voltage Va is used as the supply voltage for the regulator 30 and the buffer 40, and is also output, as a first output voltage Vout1, to outside the semiconductor device 1. On the other hand, the second internal supply voltage Vb is used as the supply voltage for the reference voltage generation circuit 20.

The reference voltage generation circuit 20 is connected between an application terminal of the second internal supply voltage Vb and the application terminal of the ground voltage Vss. The reference voltage generation circuit 20 receives the second internal supply voltage Vb from the pre-regulator 10, and generates a predetermined reference voltage Vref. In particular, in a case where the input voltage Vin varies across a wide range, it is preferable that the pre-regulator 10 generate the reference voltage Vref not directly from the input voltage Vin but from the second internal supply voltage Vb, which results from stabilizing the input voltage Vin to a certain degree. With this configuration, it is possible to generate the reference voltage Vref stably irrespective of variation in the input voltage Vin. However, the configuration of the reference voltage generation circuit 20 is not limited to one that generates the reference voltage Vref from the second internal supply voltage Vb. Specifically, so long as a predetermined reference voltage Vref can be generated stably, the reference voltage generation circuit 20 may be configured to generate the reference voltage Vref directly from the input voltage Vin. The reference voltage Vref is output as an output feedback control reference to the regulator 30.

The regulator 30 is connected between an application terminal of the first internal supply voltage Va and the application terminal of the ground voltage Vss. The regulator 30 receives the first internal supply voltage Va from the pre-regulator 10, and generates a predetermined constant voltage Vreg. Specifically, the regulator 30 performs output feedback control so as to keep equal the constant voltage Vreg (or a feedback voltage Vfb commensurate with it) and the reference voltage Vref. The reference voltage Vref is output to the buffer 40, and is also output as a second output voltage Vout2 to outside the semiconductor device 1.

The buffer 40 is connected between the application terminal of the first internal supply voltage Va and the application terminal of the ground voltage Vss. The buffer 40 receives the constant voltage Vreg from the regulator 30, and outputs a buffer voltage Vbuff. The buffer voltage Vbuff is output as a third output voltage Vout3 to outside the semiconductor device 1.

The non-volatile memory 50 operates by being supplied with the input voltage Vin, and non-volatilely stores various kinds of control data (e.g., trimming signals for adjusting the temperature response of the reference voltage generation circuit 20 and the output gain of the regulator 30) used in the semiconductor device 1. Suitably usable as the non-volatile memory 50 is, for example, an EEPROM (electrically erasable programmable read-only memory). To the non-volatile memory 50 is connected, as an interface for data access from outside the semiconductor device 1, an I$^2$C bus which uses a clock signal SCL and a data signal SDA.

Though not explicitly illustrated in FIG. 1, the semiconductor device 1 may be configured to receive an enable signal for controlling the different blocks mentioned above (in particular, the pre-regulator 10, the reference voltage generation circuit 20, the regulator 30, and the buffer 40) between an enabled and a disabled state.

Figure 2:
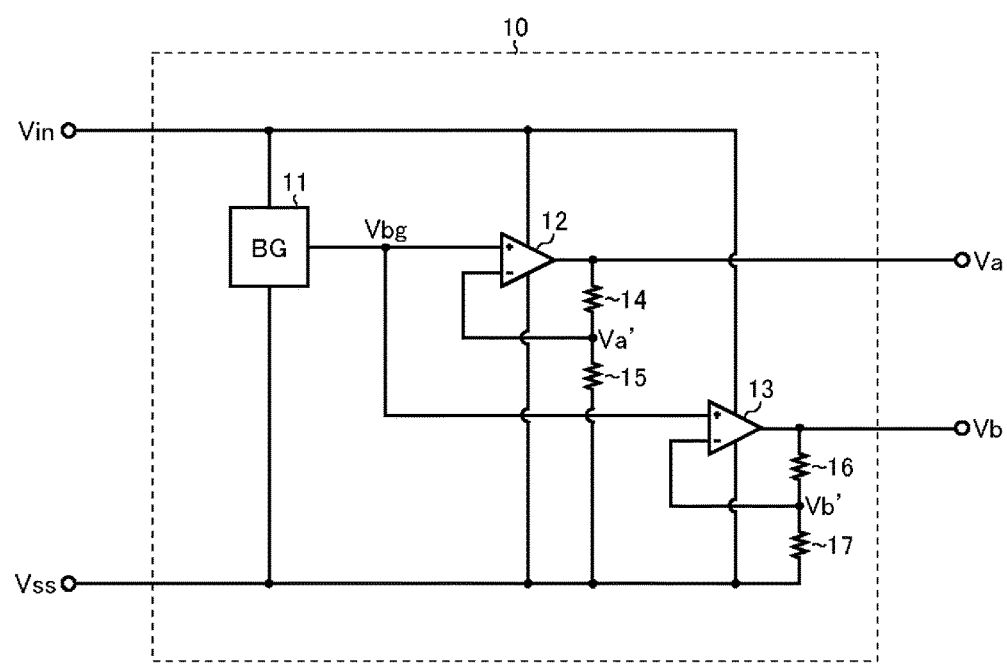
FIG. 2 is a circuit diagram showing one configuration example of a pre-regulator 10.

Pre-Regulator:

FIG. 2 is a circuit diagram showing one configuration example of the pre-regulator 10. The pre-regulator 10 of this configuration example includes a bandgap reference voltage source (BG) 11, operational amplifiers 12 and 13, and resistors 14 to 17.

The bandgap reference voltage source 11 is connected between the application terminal of the input voltage Vin and the application terminal of the ground voltage Vss. The bandgap reference voltage source 11 produces, from the input voltage Vin, a bandgap reference voltage Vbg which is hardly susceptible to variation in the supply voltage or variation in temperature.

The operational amplifier 12 is connected between the application terminal of the input voltage Vin and the application terminal of the ground voltage Vss. The operational amplifier 12 performs output feedback control on the first internal supply voltage Va so as to keep equal the bandgap reference voltage Vbg, which is fed to a non-inverting input terminal (+) of the operational amplifier 12, and a division voltage Va' (i.e., a voltage resulting from the first internal supply voltage Va being divided), which is fed to an inverting input terminal (−) of the operational amplifier 12.

The operational amplifier 13 is connected between the application terminal of the input voltage Vin and the application terminal of the ground voltage Vss. The operational amplifier 13 performs output feedback control on the second internal supply voltage Vb so as to keep equal the bandgap reference voltage Vbg, which is fed to a non-inverting input terminal (+) of the operational amplifier 13, and a division voltage Vb' (i.e., a voltage resulting from the second internal supply voltage Vb being divided), which is fed to an inverting input terminal (−) of the operational amplifier 13.

The resistors 14 and 15 are connected between an output terminal of the operational amplifier 12 (i.e., the application terminal of the first internal supply voltage Va) and the application terminal of the ground voltage Vss, and function as a first voltage division circuit that outputs the division voltage Va' from the connection node between them.

The resistors 16 and 17 are connected between an output terminal of the operational amplifier 13 (i.e., the terminal to which the second internal supply voltage Vb is applied) and the application terminal of the ground voltage Vss, and function as a second voltage division circuit that outputs the division voltage Vb' from the connection node between them.

Figure 3:
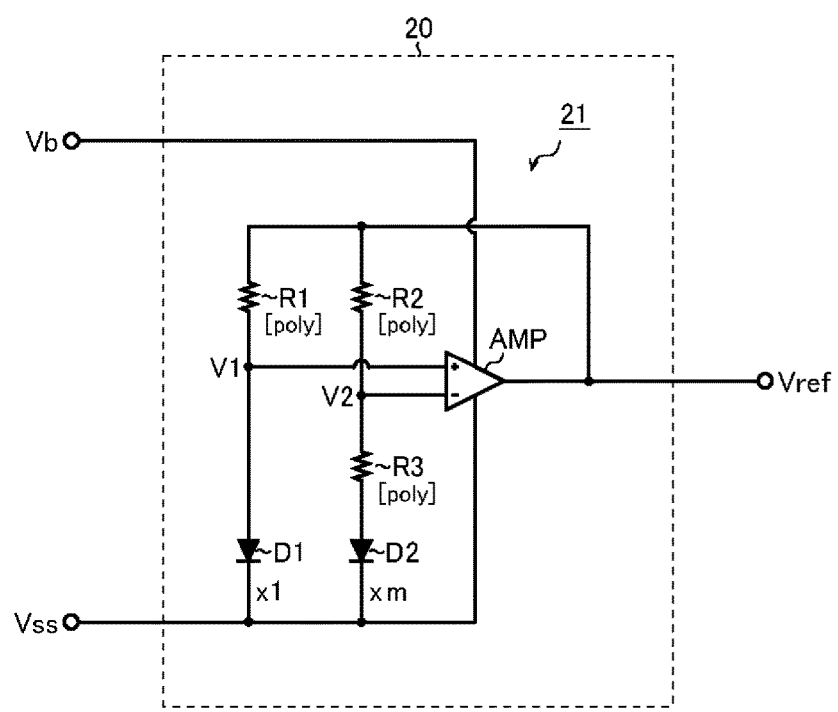
FIG. 3 is a circuit diagram showing a first configuration example of a reference voltage generation circuit 20.

Reference Voltage Generation Circuit (1st Configuration Example):

FIG. 3 is a circuit diagram showing a first configuration example of the reference voltage generation circuit 20. Suitably usable as the reference voltage generation circuit 20 is a bandgap reference voltage source 21. The bandgap reference voltage source 21 includes resistors R1 to R3 (all polyresistors, i.e., polysilicon resistors), diodes D1 and D2, and an operational amplifier AMP.

A first power terminal of the operational amplifier AMP is connected to the application terminal of the second internal supply voltage Vb. A second power terminal of the operational amplifier AMP is connected to the application terminal of the ground voltage Vss. A first end of the resistor R1 and a first end of the resistor R2 are both connected to an output terminal of the operational amplifier AMP (i.e., an output terminal of the reference voltage Vref). The second end of the resistor R1 and an anode of the diode D1 are both connected to a non-inverting input terminal (+) of the operational amplifier AMP. A second end of the resistor R2 and a first end of the resistor R3 are both connected to an inverting input terminal (−) of the operational amplifier AMP. A second end of the resistor R3 is connected to an anode of the diode D2. A cathode of the diode D1 and a cathode of the diode D2 are both connected to the application terminal of the ground voltage Vss. The resistor R3 may be connected, instead of to the anode side of the diode D2, to the cathode side of the diode D2.

The diode D2 corresponds to a diode that is composed of m diodes (e.g., m=4), each equivalent to the diode D1, connected in parallel with each other. That is, the diode D2 is designed to have a PN junction area that is m times as large as that of the diode D1. Accordingly, the current density in the diode D2 is lower than that in the diode D1. The diodes D1 and D2 may each be implemented as a transistor having its gate and drain, or base and collector, short-circuited together (i.e., a so-called diode-connected transistor).

The above circuit configuration can be applied equally to the bandgap reference voltage source 11 mentioned previously.

Next, the operation of the bandgap reference voltage source 21 will be described. The operational amplifier AMP performs negative feedback control on the reference voltage Vref so as to keep equal (to short-circuit on an imaginary basis) a first node voltage V1, which is fed to a non-inverting input terminal (+) of the operational amplifier AMP, and a second node voltage V2, which is fed to an inverting input terminal (−) of the operational amplifier AMP. Thus, the reference voltage Vref is given by formula (1) below.

$$Vref = Vf1 + \frac{R2}{R3} \cdot Vt \cdot \ln\left(\frac{R2}{R1} \cdot \frac{Is2}{Is1}\right) \quad (1)$$

R1 to R3 represent the resistance values of the resistors R1 to R3 (e.g., R1=R2=250 kΩ), Vf1 represents the forward voltage drop across the diode D1, Is1 and Is2 represent the saturation currents of the diodes D1 and D2, and Vt represents the thermal voltage.

In Formula (1) above, the first term in the right side has a negative temperature coefficient, and the second term in the right side has a positive temperature coefficient. Accordingly, by properly adjusting the resistance values of the resistors R1 to R3 and the current values of the saturation currents Is1 and Is2, it is ideally possible to give the reference voltage Vref a flat temperature response.

Figure 4:
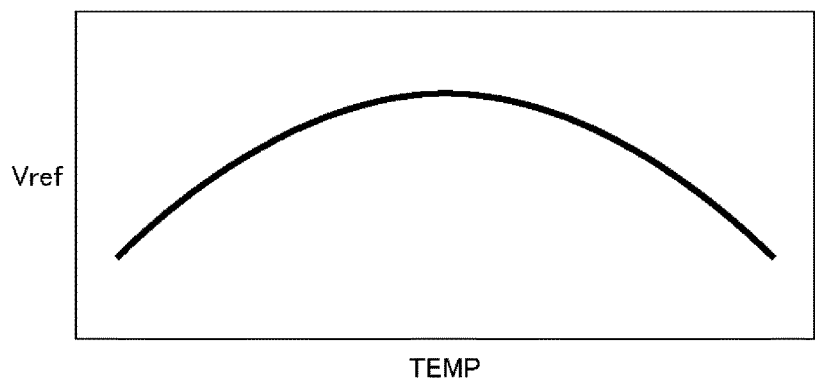
FIG. 4 is a diagram showing a temperature response of a reference voltage Vref in the first configuration example.

FIG. 4 is a diagram showing a temperature response of the reference voltage Vref in the first configuration example. In FIG. 4, the horizontal axis represents temperature, and the vertical axis represents the reference voltage Vref. As shown there, in the first configuration example, the reference voltage Vref has a temperature response that is not actually flat but rather convex (dome-shaped), having a local maximum with respect to variation in temperature. This temperature response causes a temperature drift of about 18 ppm/° C. in the reference voltage Vref, leaving room for further improvement.

Figure 5:
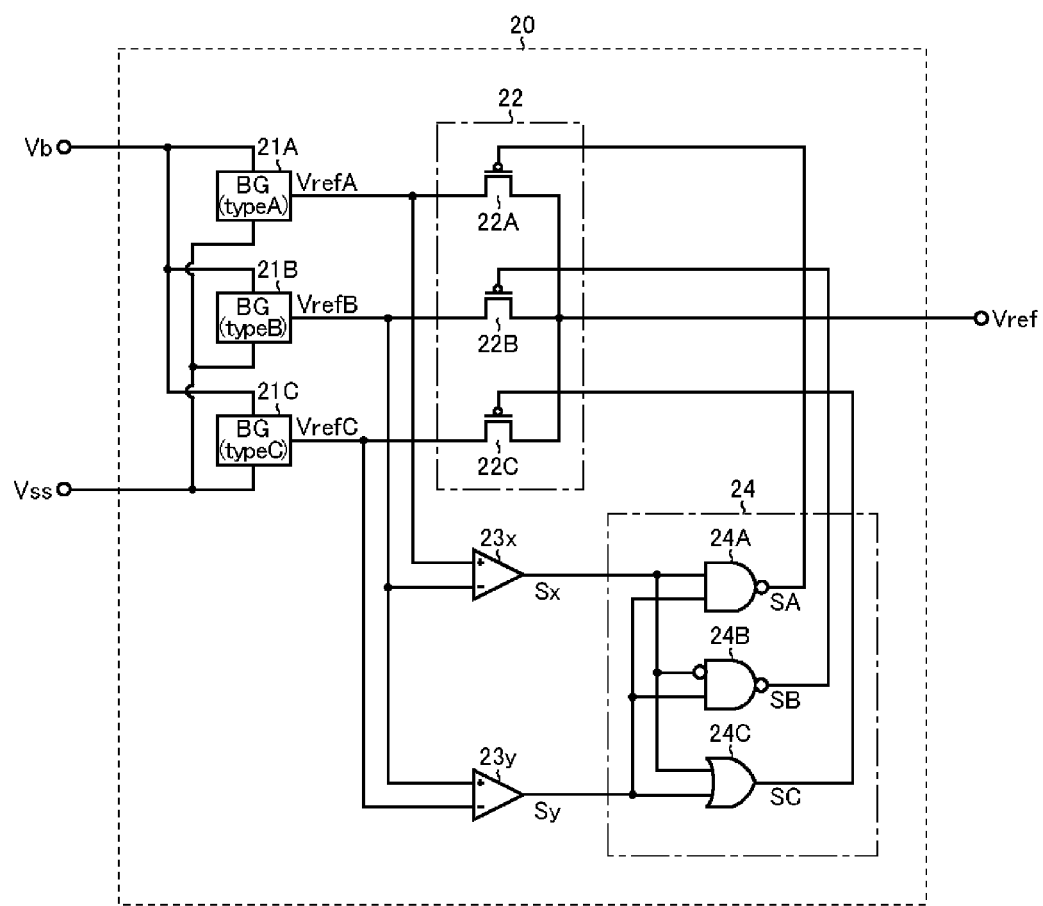
FIG. 5 is a circuit diagram showing a second configuration example of a reference voltage generation circuit 20.

Reference Voltage Generation Circuit (2nd Configuration Example):

FIG. 5 is a circuit diagram showing a second configuration example of the reference voltage generation circuit 20. The reference voltage generation circuit 20 of the second configuration example includes a first bandgap reference voltage source 21A, a second bandgap reference voltage source 21B, a third bandgap reference voltage source 21C, a selector 22, a first comparator 23x, a second comparator 23y, and a logic operator 24.

The first bandgap reference voltage source 21A is connected between the application terminal of the second internal supply voltage Vb and the application terminal of the ground voltage Vss, and generates a first reference voltage VrefA.

The second bandgap reference voltage source 21B is connected between the application terminal of the second internal supply voltage Vb and the application terminal of the ground voltage Vss, and generates a second reference voltage VrefB, which has a temperature response different from that of the first reference voltage VrefA.

The third bandgap reference voltage source 21C is connected between the application terminal of the second internal supply voltage Vb and the application terminal of the ground voltage Vss, and generates a third reference voltage VrefC, which has a temperature response different from either of those of the first and second reference voltages VrefA and VrefB.

The first, second, and third bandgap reference voltage sources 21A, 21B, and 21C are each configured like the bandgap reference voltage source 21 shown in FIG. 3, except that the resistance ratio (R2/R3) of the resistor R2 to the resistor R3 differs from one reference voltage source to another.

The selector 22 includes PMOSFETs (p-channel type metal-oxide-semiconductor field-effect transistors) 22A to 22C. According to switching signals SA to SC fed to it from the logic operator 24, the selector 22 selectively outputs one of the first, second, and third reference voltages VrefA, VrefB, and VrefC as the reference voltage Vref.

The PMOSFET 22A is connected between an output terminal of the first bandgap reference voltage source 21A (i.e., an output terminal of the first reference voltage VrefA) and an output terminal of the reference voltage generation circuit 20 (i.e., the output terminal of the reference voltage Vref). The PMOSFET 22A is ON when the switching signal SA is at low level, and is OFF when the switching signal SA is at high level.

The PMOSFET 22B is connected between an output terminal of the second bandgap reference voltage source 21B (i.e., an output terminal of the second reference voltage VrefB) and the output terminal of the reference voltage generation circuit 20 (i.e., the output terminal of the reference voltage Vref). The PMOSFET 22B is ON when the switching signal SB is at low level, and is OFF when the switching signal SB is at high level.

The PMOSFET 22C is connected between an output terminal of the third bandgap reference voltage source 21C (i.e., an output terminal of the third reference voltage VrefC) and the output terminal of the reference voltage generation circuit 20 (i.e., the output terminal of the reference voltage Vref). The PMOSFET 22C is ON when the switching signal SC is at low level, and is OFF when the switching signal SC is at high level.

Thus, when the switching signal SA is at low level and the switching signals SB and SC are at high level, the first reference voltage VrefA is selectively output as the reference voltage Vref. When the switching signal SB is at low level and the switching signals SA and SC are at high level, the second reference voltage VrefB is selectively output as the reference voltage Vref. When the switching signal SC is at low level and the switching signals SA and SB are at high level, the third reference voltage VrefC is selectively output as the reference voltage Vref.

The first comparator 23x generates a first comparison signal Sx by comparing together the first reference voltage VrefA, which is fed to a non-inverting input terminal (+) of the first comparator 23x, and the second reference voltage VrefB, which is fed to an inverting input terminal (−) of the first comparator 23x. The first comparison signal Sx is at high level when the first reference voltage VrefA is higher than the second reference voltage VrefB, and is at low level when, inversely, the first reference voltage VrefA is lower than the second reference voltage VrefB.

The second comparator 23y generates a second comparison signal Sy by comparing together the second reference voltage VrefB, which is fed to a non-inverting input terminal (+) of the second comparator 23y, and the third reference voltage VrefC, which is fed to an inverting input terminal (−) of the second comparator 23y. The second comparison signal Sy is at high level when the second reference voltage VrefB is higher than the third reference voltage VrefC, and is at low level when, inversely, the second reference voltage VrefB is lower than the third reference voltage VrefC.

The logic operator 24 is a circuit block that generates the switching signals SA to SC from the first and second comparison signals Sx and Sy, and includes a NAND gate 24a, a NAND gate 24b, and an OR gate 24c.

The NAND gate 24a generates the switching signal SA by performing a NAND (negative logical multiplication) operation between the first comparison signal Sx, which is fed to a first input terminal of the NAND gate 24a, and the second comparison signal Sy, which is fed to a second input terminal of the NAND gate 24a. The switching signal SA is at low level when the first and second comparison signals Sx and Sy are both at high level, and is at high level when at least one of the first and second comparison signals Sx and Sy is at low level.

The NAND gate 24b generates the switching signal SB by performing a NAND (negative logical multiplication) operation between the first comparison signal Sx, which is fed to a first, inverting, input terminal of the NAND gate 24b, and the second comparison signal Sy, which is fed to a second input terminal of the NAND gate 24b. The switching signal SB is at low level when the first comparison signal Sx is at low level and the second comparison signal Sy is at high level, and is at high level when either the first comparison signal Sx is at high level or the second comparison signal Sy is at low level.

The OR gate 24c generates the switching signal SC by performing an OR (logical addition) operation between the first comparison signal Sx, which is fed to a first input terminal of the OR gate 24c, and the second comparison signal Sy, which is fed to a second input terminal of the OR gate 24c. The switching signal SC is at low level when the first and second comparison signals Sx and Sy are both at low level, and is at high level when at least one of the first and second comparison signals Sx and Sy is at high level.

Figure 6:
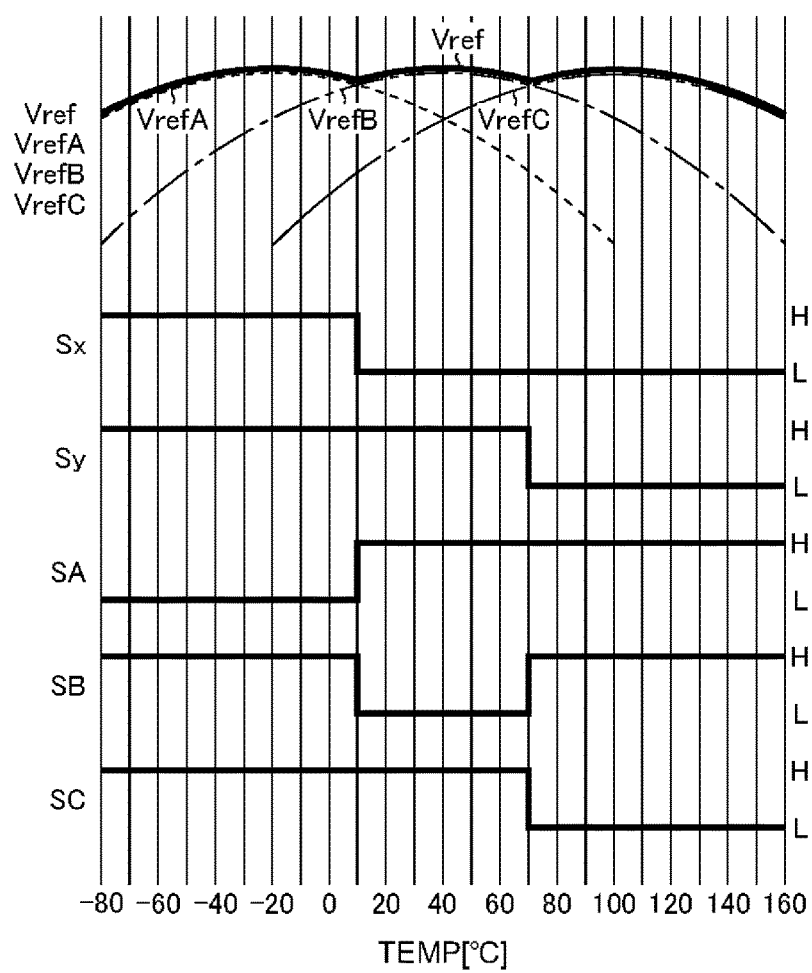
FIG. 6 is a diagram showing a temperature response of a reference voltage Vref in the second configuration example.

FIG. 6 is a diagram showing a temperature response of the reference voltage Vref in the second configuration example, depicting, from top down, the reference voltage Vref (a thick solid line), the first reference voltage VrefA (a broken line), the second reference voltage VrefB (a dash-and-dot line), the third reference voltage VrefC (a dash-dot-dot line), the first comparison signal Sx, the second comparison signal Sy, and the switching signals SA to SC. In FIG. 6, the horizontal axis represents temperature (−80° C. to +160° C.).

In the example shown in FIG. 6, the first bandgap reference voltage source 21A is designed so that the first reference voltage VrefA exhibits a temperature response having a local maximum at about −20° C. The second bandgap reference voltage source 21B is designed so that the second reference voltage VrefB exhibits a temperature response having a local maximum at about +40° C. The third bandgap reference voltage source 21C is designed so that the third reference voltage VrefC exhibits a temperature response having a local maximum at about +100° C. The peak temperatures can be adjusted as desired by varying the resistance ratio of the resistor R2 to the resistor R3.

In a temperature range where VrefA>VrefB>VrefC (below about +10° C.), the first and second comparison signals Sx and Sy are both at high level. Thus, the switching signal SA is at low level and the switching signals SB and SC are at high level. As a result, the PMOSFET 22A is ON while the PMOSFETs 22B and 22C are OFF, and thus the first reference voltage VrefA is output as the reference voltage Vref.

In a temperature range where VrefB>VrefA and VrefB>VrefC (from about +10° C. to about +70° C.), the first comparison signal Sx is at low level and the second comparison signal Sy is at high level. Thus, the switching signal SB is at low level, and the switching signals SA and SC are at high level. As a result, the PMOSFET 22B is ON while the PMOSFETs 22A and 22C are OFF, and thus the second reference voltage VrefB is output as the reference voltage Vref.

In a temperature range where VrefC>VrefB>VrefA (above about +70° C.), the first and second comparison signals Sx and Sy are both at low level. Thus, the switching signal SC is at low level, and the switching signals SA and SB are at high level. As a result, the PMOSFET 22C is ON while the PMOSFETs 22A and 22B are OFF, and thus the third reference voltage VrefC is output as the reference voltage Vref.

As described above, despite having an extremely simple circuit configuration, the reference voltage generation circuit 20 of the second configuration example can logically select a region with a flat temperature response (around a local maximum of each of the first, second, and third reference voltages VrefA, VrefB, and VrefC) to output an appropriate reference voltage Vref. It is thus possible to reduce a temperature drift in the reference voltage Vref.

Although the above description deals with a configuration where one of three bandgap reference voltage sources is selectively used, this is not meant to limit the number of bandgap reference voltage sources used; there may be provided two, or four or more, bandgap reference voltage sources.

Figure 7:
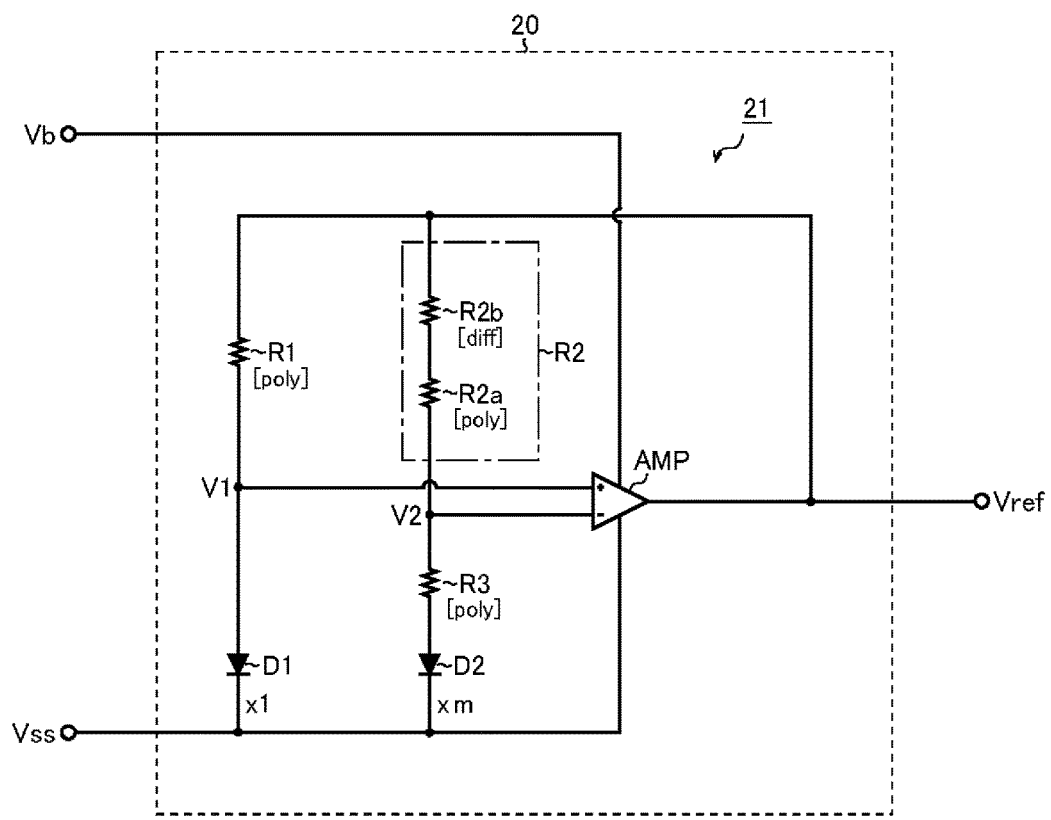
FIG. 7 is a circuit diagram showing a third configuration example of a reference voltage generation circuit 20.

Reference Voltage Generation Circuit (3rd Configuration Example):

FIG. 7 is a circuit diagram showing a third configuration example of the reference voltage generation circuit 20. The third configuration example is based on the first configuration example (FIG. 3), and is characterized in that the resistor R2 is composed of a combination of a polyresistor portion R2a and a diffusion resistor portion R2b. Accordingly, in the following description, such components as find their counterparts in the first configuration example are identified by the same reference signs as in FIG. 1, and no overlapping description will be repeated. The following description thus focuses on features unique to the third configuration example.

Used as the polyresistor portion R2a is, like the resistors R1 and R3, a polyresistor (polysilicon resistor). On the other hand, used as the diffusion resistor portion R2b is a diffusion resistor having a temperature response different from that of the polyresistor portion R2a.

The resistors R1 and R2 are designed to have equal resistance values. That is, the polyresistor portion R2a and the diffusion resistor portion R2b are designed so that their composite resistance value equals the resistance value of the resistor R1 (e.g., R2a+R2b=R1=250 kΩ).

Figure 8:
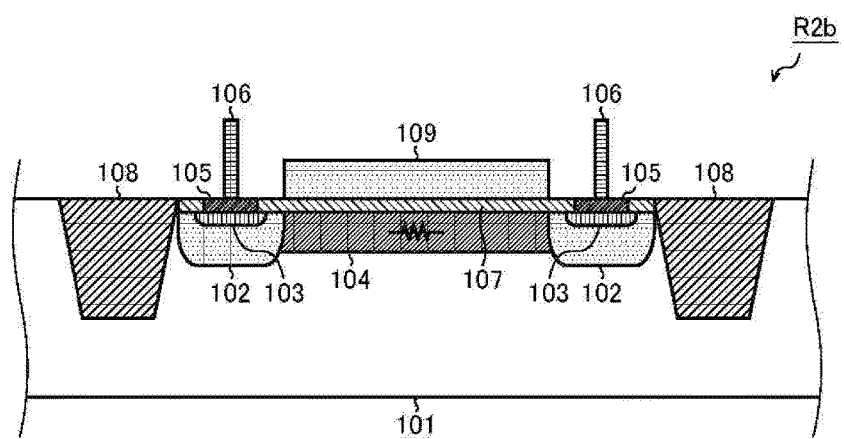
FIG. 8 is a vertical sectional view showing a device structure of a diffusion resistor portion R2b.

FIG. 8 is a vertical sectional view showing a device structure of the diffusion resistor portion R2b. As shown there, the diffusion resistor portion R2b includes a pair of first low-concentration n-type diffusion regions 102 formed in a p-type semiconductor substrate 101, a pair of high-concentration n-type diffusion regions 103 (contact regions) formed in the pair of first low-concentration n-type diffusion regions 102 respectively, a second low-concentration n-type diffusion region 104 formed in the semiconductor substrate 101 between the pair of first low-concentration n-type diffusion regions 102, and a pair of silicide electrodes 105 formed on top of the pair of high-concentration n-type diffusion regions 103 respectively.

To the pair of silicide electrodes 105, a pair of leads 106 are connected respectively. The pair of first low-concentration n-type diffusion regions 102, the pair of high-concentration n-type diffusion regions 103, and the second low-concentration n-type diffusion region 104 are all coated with an insulation layer 107. The diffusion resistor portion R2b is electrically isolated from the other devices located around it by a device separation region 108.

The diffusion resistor portion R2b can be formed by exploiting a floating-gate cell transistor included in the non-volatile memory 50. Specifically, as shown in FIG. 8, on top of the second low-concentration n-type diffusion region 104, across the insulation layer 107, a floating-gate region 109 is formed.

In the diffusion resistor portion R2b having the device structure described above, the second low-concentration n-type diffusion region 104 (i.e., a tunnel region of a cell transistor) is used as a resistor component. Here, the dopant concentration in the second low-concentration n-type diffusion region 104 is so adjusted that the resistance value of the diffusion resistor portion R2b has a local minimum with respect to variation in temperature.

Figure 9:
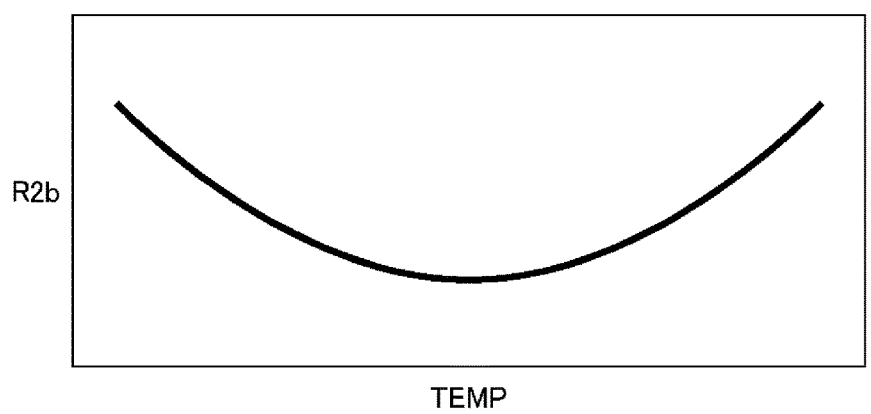
FIG. 9 is a diagram showing a temperature response of a diffusion resistor portion R2b.

FIG. 9 is a diagram showing a temperature response of the diffusion resistor portion R2b. In FIG. 9, the horizontal axis represents temperature, and the vertical axis represents the resistance value of the diffusion resistor portion R2b. As shown there, with the dopant concentration in the second low-concentration n-type diffusion region 104 adjusted properly, the resistance value of the diffusion resistor portion R2b has a temperature response that is concave (bowl-shaped), having a local minimum with respect to variation in temperature.

Figure 10:
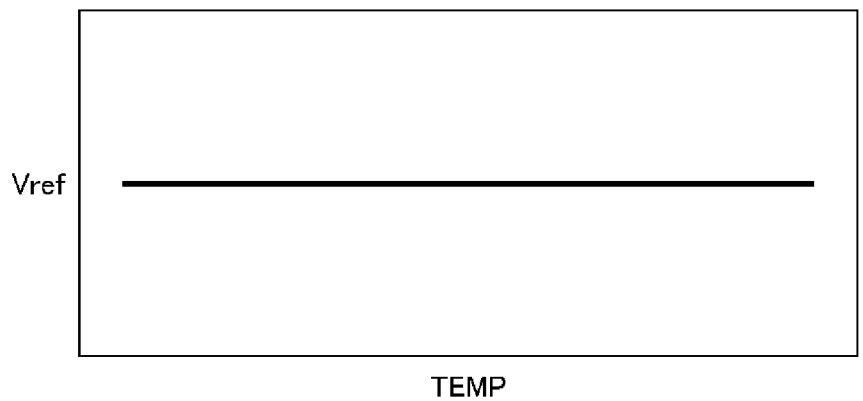
FIG. 10 is a diagram showing a temperature response of a reference voltage Vref in the third configuration example.

FIG. 10 is a diagram showing a temperature response of the reference voltage Vref in the third configuration example. In FIG. 10, the horizontal axis represents temperature, and the vertical axis represents the reference voltage Vref. By adding the diffusion resistor portion R2b having the temperature response shown in FIG. 9 as part of the resistor R2 provided in the bandgap reference voltage source 21, it is possible to cancel the temperature response shown in FIG. 4.

It is thus possible to give the reference voltage Vref a temperature response that is extremely flat as shown in FIG. 10, and hence to reduce a temperature drift in the reference voltage Vref to as small as 1 ppm/° C. or less (e.g., 0.2 ppm/° C.).

Although the above description deals with a configuration where a diffusion resistor portion R2b is added as part of the resistor R2, it is also possible to reverse the relationship between the resistors R1 and R2; that is, by adding a diffusion resistor as part of the resistor R1, it is possible to obtain the same effect as described above.

Figure 11:
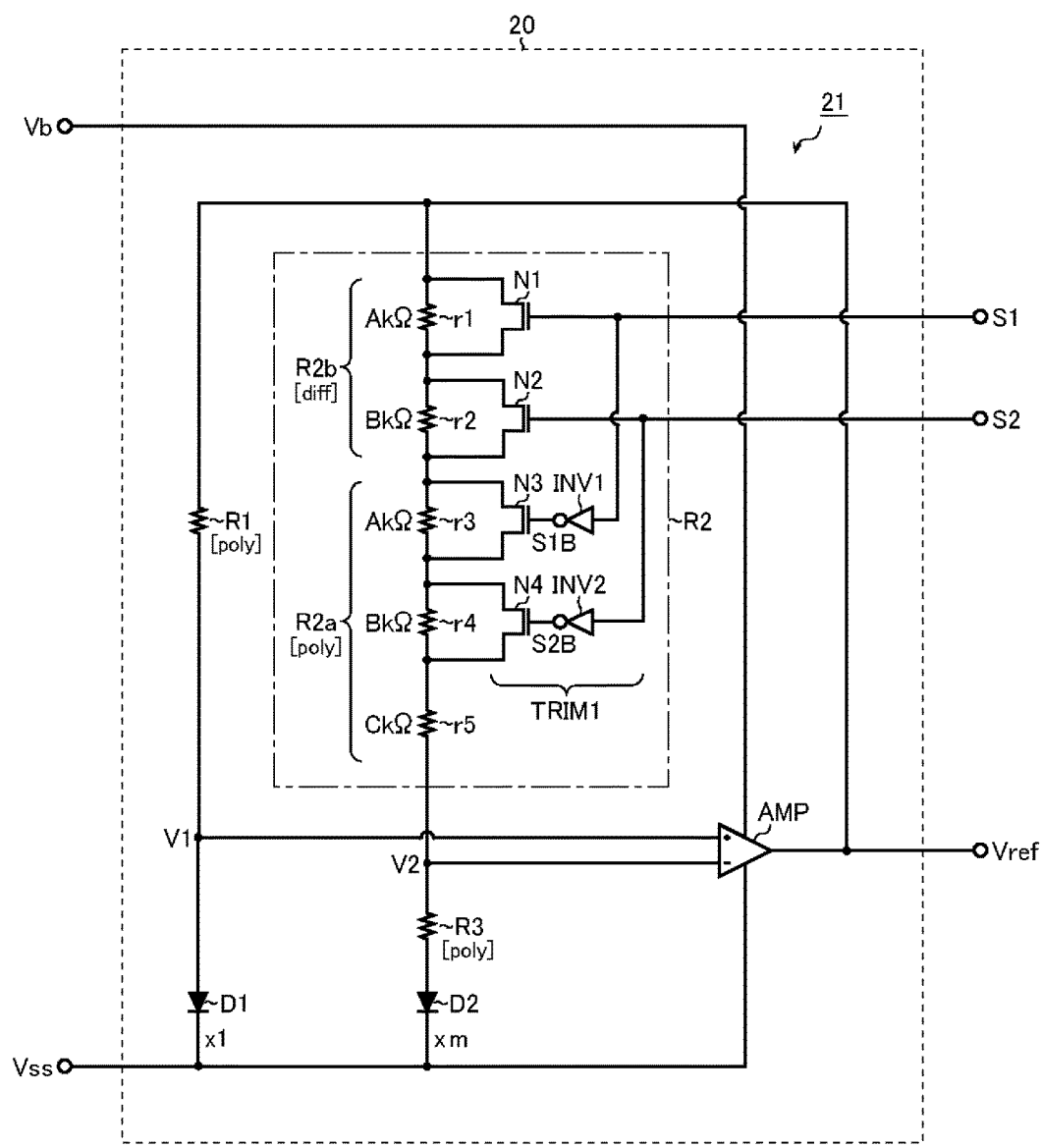
FIG. 11 is a circuit diagram showing a fourth configuration example of a reference voltage generation circuit 20.

Reference Voltage Generation Circuit (4th Configuration Example):

FIG. 11 is a circuit diagram showing a fourth configuration example of the reference voltage generation circuit 20. The fourth configuration example is based on the third configuration example (FIG. 7) described previously, and is characterized in that the resistor R2 is additionally provided with a trimming function (a function whereby the contribution proportions of the polyresistor portion R2a and the diffusion resistor portion R2b can be adjusted). Accordingly, in the following description, such components as find their counterparts in the third configuration example are identified by the same reference signs as in FIG. 7, and no overlapping description will be repeated. The following description thus focuses on features unique to the fourth configuration example.

In the reference voltage generation circuit 20 of the fourth configuration example, the resistor R2 includes a polyresistor portion R2a, a diffusion resistor portion R2b, and a trimming portion TRIM1. The trimming portion TRIM1 is fed with trimming signals S1 and S2, which are read from the non-volatile memory 50.

The diffusion resistor portion R2b includes a diffusion resistor r1 with a resistance value of A kΩ and a diffusion resistor r2 with a resistance value of B kΩ (≠A kΩ). On the other hand, the polyresistor portion R2a includes a polyresistor r3 with a resistance value of A kΩ, a polyresistor r4 with a resistance value of B kΩ, and a polyresistor r5 with a resistance value of C kΩ. The diffusion resistors r1 and r2 and the polyresistors r3 to r5 are connected in series, in the illustrated order, between an output terminal and an inverting input terminal (−) of an operational amplifier AMP.

The trimming portion TRIM1 is a circuit that adjusts the resistance values of the polyresistor portion R2a and the diffusion resistor portion R2b according to the trimming signals S1 and S2 while keeping their composite resistance value constant. The trimming portion TRIM1 includes NMOSFETs (n-channel type MOSFETs) N1 to N4 and inverters INV1 and INV2.

The NMOSFET N1 is connected in parallel with the diffusion resistor r1, and is turned ON and OFF according to the trimming signal S1, which is fed to a gate of the NMOSFET N1. More specifically, the NMOSFET N1 is ON when the trimming signal S1 is at high level, and is OFF when the trimming signal S1 is at low level.

The NMOSFET N2 is connected in parallel with the diffusion resistor r2, and is turned ON and OFF according to the trimming signal S2, which is fed to a gate of the NMOSFET N2. More specifically, the NMOSFET N2 is ON when the trimming signal S2 is at high level, and is OFF when the trimming signal S2 is at low level.

The NMOSFET N3 is connected in parallel with the polyresistor r3, and is turned ON and OFF according to an inverted trimming signal S1B (a logical inversion of the trimming signal S1), which is fed to a gate of the NMOSFET N3 via the inverter INV1. More specifically, the NMOSFET N3 is ON when the trimming signal S1B is at high level, and is OFF when the trimming signal S1B is at low level.

The NMOSFET N4 is connected in parallel with the polyresistor r4, and is turned ON and OFF according to an inverted trimming signal S2B (a logical inversion of the trimming signal S2), which is fed to a gate of the NMOSFET N4 via the inverter INV2. More specifically, the NMOSFET N4 is ON when the trimming signal S2B is at high level, and is OFF when the trimming signal S2B is at low level.

First, consider a first state where the trimming signal S1 at low level and the trimming signal S2 is at high level. In this state, the NMOSFETs N1 and N4 are OFF, and the NMOSFETs N2 and N3 are ON. Accordingly, the diffusion resistor r2 and the polyresistor r3 are each short-circuited, and thus the resistor R2 is composed of the diffusion resistor r1 and the polyresistors r4 and r5 connected in series.

Next, consider a second state where the trimming signal S1 at high level and the trimming signal S2 is at low level. In this state, the NMOSFETs N1 and N4 are ON, and the NMOSFETs N2 and N3 are OFF. Accordingly, the diffusion resistor r2 and the polyresistor r4 are each short-circuited, and thus the resistor R2 is composed of the diffusion resistor r2 and the polyresistors r3 and r5 connected in series.

In both the first and second states mentioned above, the composite resistance value of the resistor R2 equals (A+B+C) kΩ, and this constant value is designed to be equal to the resistance value of the resistor R1 (e.g., R2=R1=250 kΩ).

Adding a trimming function as described above makes it possible to adjust the contribution proportions of the polyresistor portion R2a and the diffusion resistor portion R2b. Thus, even if the diffusion resistor portion R2b has production variations, it is possible to reduce their influence. It is thus possible to give the reference voltage Vref a temperature response that is extremely flat irrespective of production variations in the diffusion resistor portion R2b.

The polyresistor r5, with which no NMOSFET is connected in parallel, is incorporated in the resistor R2 both in the first and second states. Thus, by adjusting the resistance value (C kΩ) of the polyresistor r5, it is possible to determine the bare contribution proportion of the diffusion resistor portion R2b.

Although the above description assumes a case where the trimming signals S1 and S2 are exclusive logic signals with respect to each other (each a binary signal such that when one is at high level the other is at low level), it is also possible to hold the trimming signals S1 and S2 at an identical logic level (high or low level) in a case where behavior needs to be confirmed also when the diffusion resistors r1 and r2 are both incorporated in the resistor R2 or when the resistor R2 is composed only of the polyresistors r3 to r5.

On the other hand, in a case where no confirmation of behavior as described above is needed, the trimming signals S1 and S2 can be integrated into a single trimming signal S0. In that case, for example, the trimming signal S0 can be fed to the gates of the NMOSFETs N1 and N4, and an inverted trimming signal S0B (a logical inversion of the trimming signal S0) can be fed to the gates of the NMOSFETs N2 and N3.

Figure 12:
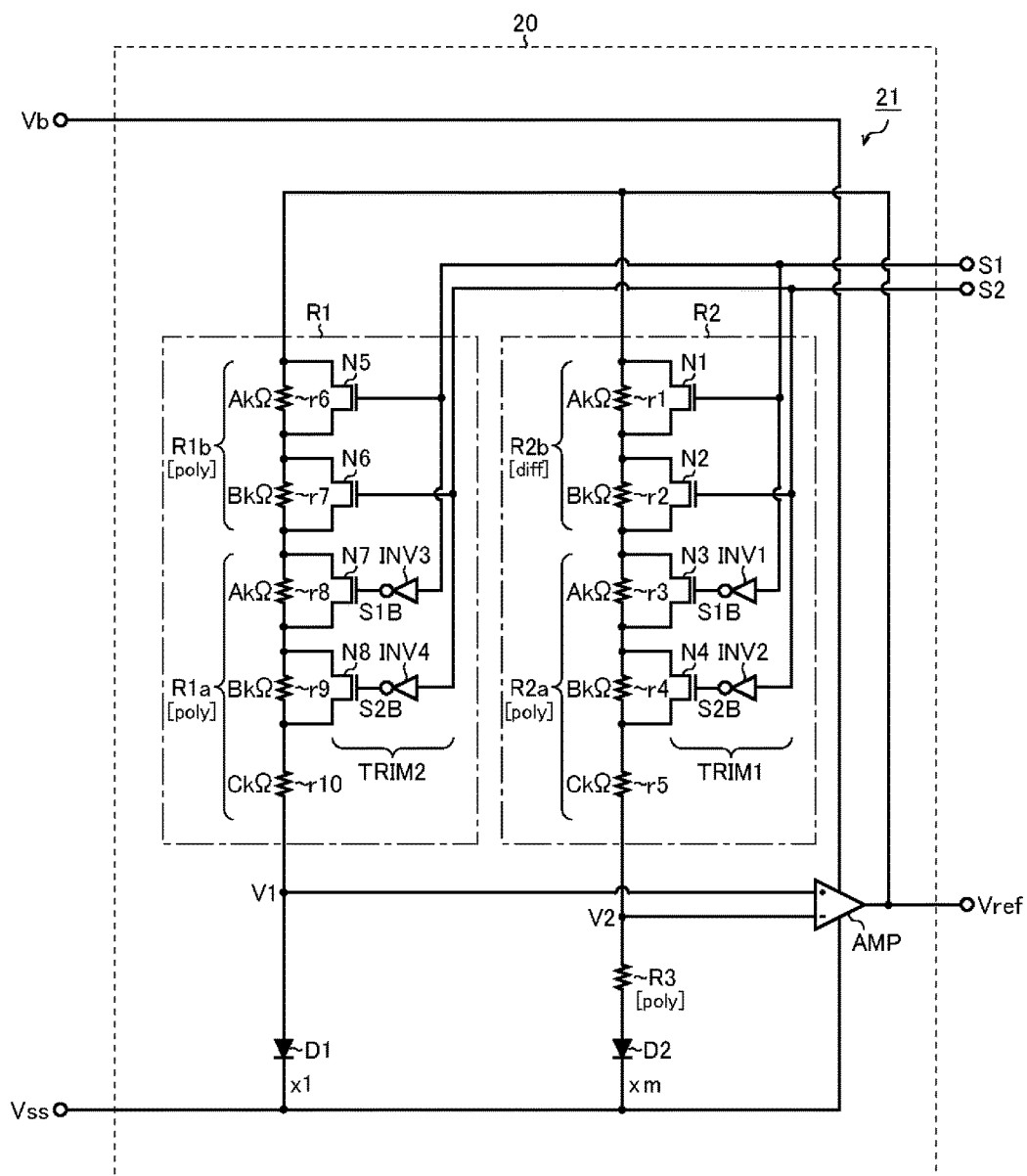
FIG. 12 is a circuit diagram showing a fifth configuration example of a reference voltage generation circuit 20.

Reference Voltage Generation Circuit (5th Configuration Example):

FIG. 12 is a circuit diagram showing a fifth configuration example of the reference voltage generation circuit 20. The fifth configuration example is based on the fourth configuration example (FIG. 11) described previously, and is characterized in that the resistor R1 too is additionally provided with a trimming function for form's sake. Accordingly, in the following description, such components as find their counterparts in the fourth configuration example are identified by the same reference signs as in FIG. 11, and no overlapping description will be repeated. The following description thus focuses on features unique to the fifth configuration example.

In the reference voltage generation circuit 20 of the fifth configuration example, the resistor R1 includes polyresistor portions R1a and R1b and a trimming portion TRIM2.

The polyresistor portion R1b includes a polyresistor r6 with a resistance value of A kΩ and a polyresistor r7 with a resistance value of B kΩ. The polyresistor portion R1a includes a polyresistor r8 with a resistance value of A kΩ, a polyresistor r9 with a resistance value of B kΩ, and a polyresistor r10 with a resistance value of C kΩ. The polyresistors r6 to r10 are connected in series, in the illustrated order, between an output terminal and a non-inverting input terminal (+) of an operational amplifier AMP.

Here, for an easy understanding of the correspondence with the polyresistor portion R2a and the diffusion resistor portion R2b in the resistor R2, the resistor R1 is divided into two components, namely the polyresistor portions R1a and R1b. In practice, considering that the polyresistor portions R1a and R1b are each composed of a plurality of resistive elements, namely the polyresistors r6 to r10, the polyresistor portions R1a and R1b can be understood as one polyresistor portion as a whole.

The trimming portion TRIM2 is a circuit that adjusts the resistance values of the polyresistor portions R1a and R1b according to the trimming signals S1 and S2 while keeping their composite resistance value constant. The trimming portion TRIM2 includes NMOSFETs N5 to N8 and inverters INV3 and INV4.

The NMOSFET N5 is connected in parallel with the polyresistor r6, and is turned ON and OFF according to the trimming signal S1, which is fed to a gate of the NMOSFET N5. More specifically, the NMOSFET N5 is ON when the trimming signal S1 is at high level, and is OFF when the trimming signal S1 is at low level.

The NMOSFET N6 is connected in parallel with the polyresistor r7, and is turned ON and OFF according to the trimming signal S2, which is fed to a gate of the NMOSFET N6. More specifically, the NMOSFET N6 is ON when the trimming signal S2 is at high level, and is OFF when the trimming signal S2 is at low level.

The NMOSFET N7 is connected in parallel with the polyresistor r8, and is turned ON and OFF according to an inverted trimming signal S1B (a logical inversion of the trimming signal S1), which is fed to a gate of the NMOSFET N7 via the inverter INV3. More specifically, the NMOSFET N7 is ON when the trimming signal S1B is at high level, and is OFF when the trimming signal S1B is at low level.

The NMOSFET N8 is connected in parallel with the polyresistor r9, and is turned ON and OFF according to an inverted trimming signal S2B (a logical inversion of the trimming signal S2), which is fed to a gate of the NMOSFET N8 via the inverter INV4. More specifically, the NMOSFET N8 is ON when the trimming signal S2B is at high level, and is OFF when the trimming signal S2B is at low level.

First, consider a first state where the trimming signal S1 at low level and the trimming signal S2 is at high level. In this state, the NMOSFETs N5 and N8 are OFF, and the NMOSFETs N6 and N7 are ON. Accordingly, the polyresistors r7 and r8 are each short-circuited, and thus the resistor R1 is composed of the polyresistors r6, r9, and r10 connected in series.

Next, consider a second state where the trimming signal S1 at high level and the trimming signal S2 is at low level. In this state, the NMOSFETs N5 and N8 are ON, and the NMOSFETs N6 and N7 are OFF. Accordingly, the polyresistors r7 and r9 are each short-circuited, and thus the resistor R1 is composed of the polyresistor r7, r8, and r10 connected in series.

In both the first and second states mentioned above, the composite resistance value of the resistor R1 equals (A+B+C) kΩ, and this constant value is designed to be equal to the resistance value of the resistor R2 (e.g., R1=R2=250 kΩ).

Additionally providing the resistor R1, which includes no diffusion resistor, with a trimming function for form' sake as described above has the following technical significance. In a case where the fourth configuration example described previously is adopted, source-drain leak currents and sub-threshold leak currents in the NMOSFETs N1 to N4 cause a deviation in resistance value matching between the resistors R1 and R2. This problem is particularly notable at high temperatures, where such leak currents are high, possibly degrading the temperature response of the reference voltage Vref.

By contrast, with the reference voltage generation circuit 20 of the fifth configuration example, the resistors R1 and R2 have similar leak characteristics. Thus, a deviation in resistance value matching due to leak currents in NMOSFETs N1 to N4 can be canceled. It is thus possible to improve the temperature response of the reference voltage Vref at high temperatures.

Figure 13:
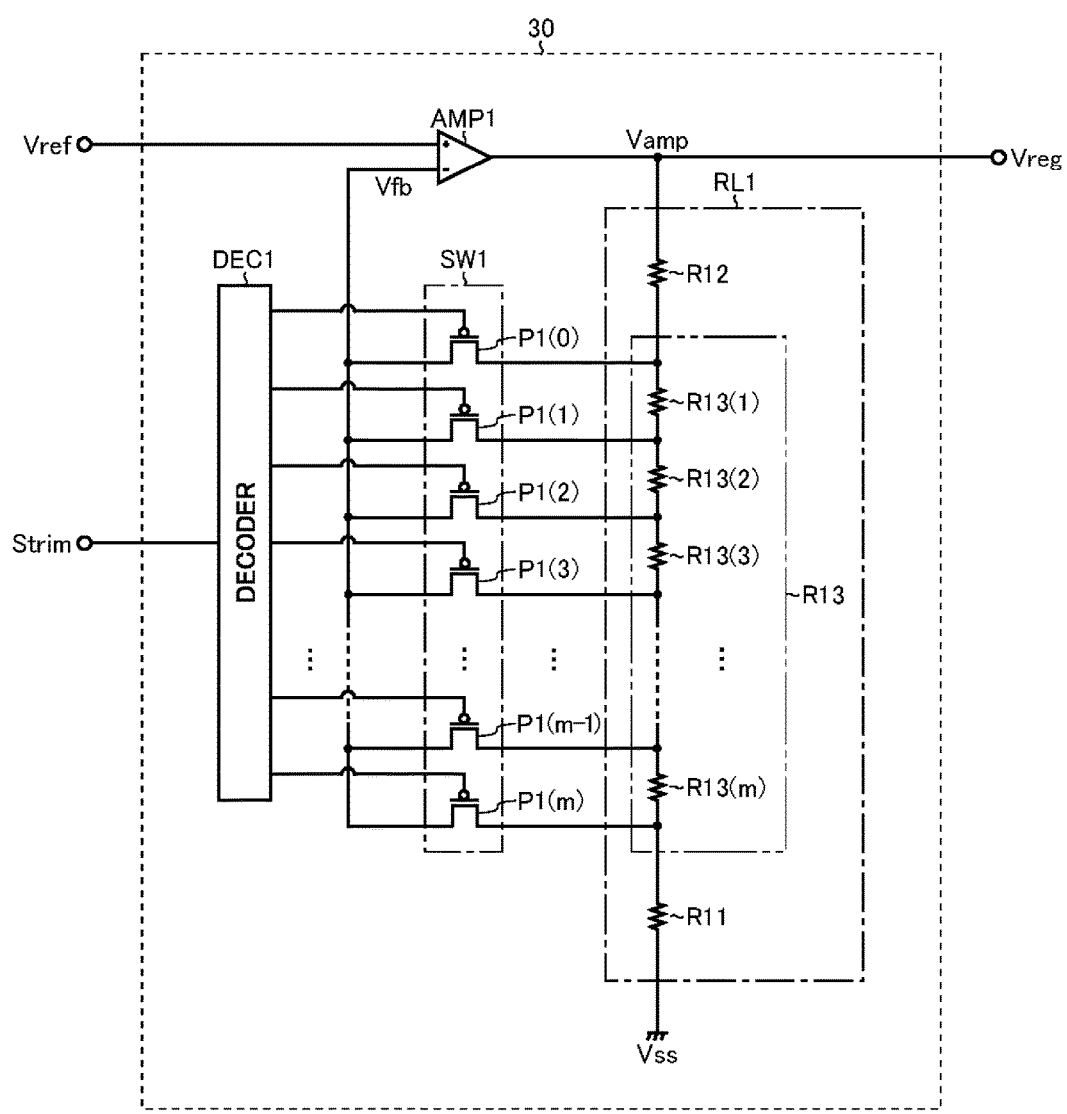
FIG. 13 is a circuit diagram showing a first configuration example of a regulator 30.

Regulator (1st Configuration Example):

FIG. 13 is a circuit diagram showing a first configuration example of the regulator 30. The regulator 30 of the first configuration example includes an operational amplifier AMP1, a resistor ladder RL1, a switch array SW1, and a decoder DEC1. The decoder DEC1 is fed with a trimming signal Strim, which is read from the non-volatile memory 50.

The operational amplifier AMP1 outputs an amplified voltage Vamp so as to keep equal the feedback voltage Vfb, which is fed to an inverting input terminal (−) of the operational amplifier AMP1, and the reference voltage Vref, which is fed to a non-inverting input terminal (+) of the operational amplifier AMP1. The amplified voltage Vamp is output as the constant voltage Vreg mentioned earlier to a subsequent stage.

The resistor ladder RL1 is a resistor voltage division circuit that divides the amplified voltage Vamp to produce the feedback voltage Vfb. The resistor ladder RL1 is composed of a resistor R11, a resistor R12, and a resistor array R13 (composed of m resistors R13(1) to R13($m$)) that are connected in series between an output terminal of the operational amplifier AMP1 (an application terminal of the amplified voltage Vamp) and the application terminal of the ground voltage Vss.

Described more specifically, the example shown in FIG. 13 is configured as follows. A first end of the resistor R12 is connected to the output terminal of the operational amplifier AMP1. A second end of the resistor R12 is connected to a first end of the resistor R13(1). A second end of the resistor R13($k$) (where k=1, 2, . . . , m−1) is connected to a first end of the resistor R13($k$+1). A second end of the resistor R13($m$) is connected to a first end of the resistor R11. A second end of the resistor R11 is connected to the application terminal of the ground voltage Vss.

The switch array SW1 is a circuit that selects one of the endmost and middle nodes of the resistor array R13 included in the resistor ladder RL1 to connect the selected node to the inverting input terminal (−) of the operational amplifier AMP1. The switch array SW1 includes PMOSFETs P1(0) to P1($m$). The PMOSFET P1(0) is connected between the first end of the resistor R13(1) and the inverting input terminal (−) of the operational amplifier AMP1, and is turned ON and OFF according to instructions from the decoder DEC1. The PMOSFETs P1(1) to P1($m$) are connected respectively between the second ends of the resistors R13(1) to R13($m$) and the inverting input terminal (−) of the operational amplifier AMP1, and are turned ON and OFF according to instructions from the decoder DEC1.

The decoder DEC1 turns ON and OFF the PMOSFETs P1(0) to P1($m$) included in the switch array SW1 according to the trimming signal Strim. For example, when the PMOSFET P1(0) is selectively turned ON, the constant voltage Vreg is set at its lowest value VregL, which is given by formula (2a) below. On the other hand, when the PMOSFET P1($m$) is selectively turned ON, the constant voltage Vreg is set at its highest value VregH, which is given by formula (2b) below.

$$VregL = \frac{R11 + R12 + R13}{R11 + R13} \cdot Vref \quad (2a)$$

$$VregH = \frac{R11 + R12 + R13}{R13} \cdot Vref \quad (2b)$$

In these formulae, R11 and R12 represent the resistance values of the resistors R11 and R12 respectively; R13 represents the maximum composite resistance value of the resistor array R13 (i.e., the sum of all the resistance values of the resistors R13(1) to R13($m$)).

By selectively turning ON one of the PMOSFETs P1(1) to P1($m$−1), it is possible to set the constant voltage Vreg at a voltage in the range of VregL<Vreg<VregH.

In this way, in the regulator 30 of the first configuration example, it is possible to adjust the ratio of voltage division by the resistor ladder RL1 (and hence the output gain of the regulator 30) as desired according to the trimming signal Strim. It is thus possible to enhance the precision of the constant voltage Vreg.

In particular, in the regulator 30 of the first configuration example, the PMOSFETs P1(0) to P1($m$) constituting the switch array SW1 are inserted in a path where no current passes. Thus, their respective ON-state resistances do not affect the precision of trimming. This is advantageous to enhancing the precision of the constant voltage Vreg.

However, in the regulator 30 of the first configuration example, the resistors R13(1) to R13(m) included in the resistor array R13 need to have equal resistance values, and cannot be assigned weights individually. Accordingly, precise trimming of the ratio of voltage division by the resistor ladder RL1 requires a large number of resistors R13(1) to R13(m) and of PMOSFETs P1(0) to P1(m). This is disadvantageous to reducing the circuit scale of the regulator 30.

Figure 14:
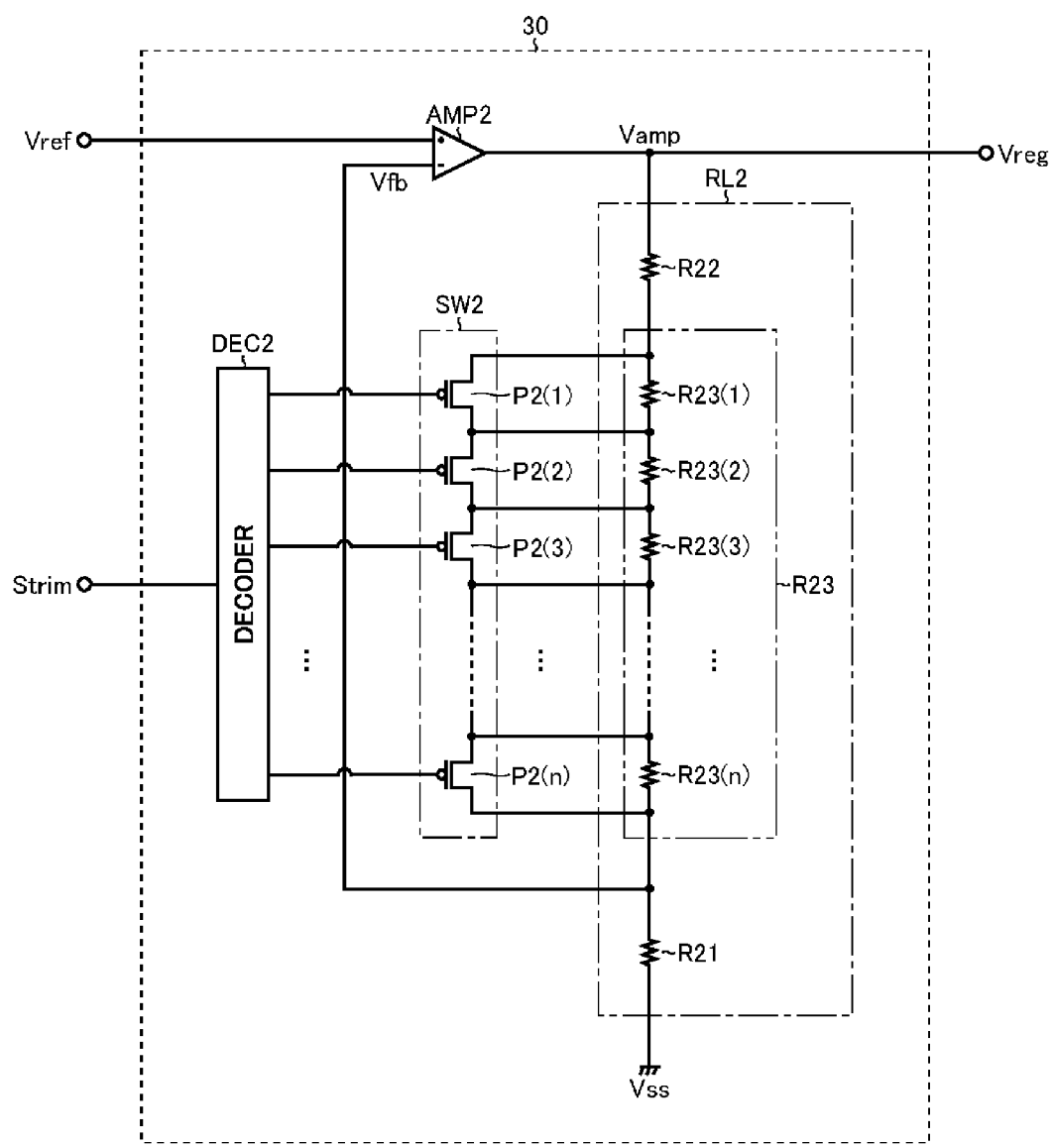
FIG. 14 is a circuit diagram showing a second configuration example of a regulator 30.

Regulator (2nd Configuration Example):

FIG. 14 is a circuit diagram showing a second configuration example of the regulator 30. The regulator 30 of the second configuration example includes an operational amplifier AMP2, a resistor ladder RL2, a switch array SW2, and a decoder DEC2. The decoder DEC2 is fed with a trimming signal Strim, which is read from the non-volatile memory 50.

The operational amplifier AMP2 outputs an amplified voltage Vamp so as to keep equal the feedback voltage Vfb, which is fed to an inverting input terminal (−) of the operational amplifier AMP2, and the reference voltage Vref, which is fed to a non-inverting input terminal (+) of the operational amplifier AMP2. The amplified voltage Vamp is output as the constant voltage Vreg mentioned earlier to a subsequent stage.

The resistor ladder RL2 is a resistor voltage division circuit that divides the amplified voltage Vamp to produce the feedback voltage Vfb. The resistor ladder RL2 is composed of a resistor R21, a resistor R22, and a resistor array R23 (composed of n resistors R23(1) to R23(n)) that are connected in series between an output terminal of the operational amplifier AMP2 (an application terminal of the amplified voltage Vamp) and the application terminal of the ground voltage Vss.

Described more specifically, the example shown in FIG. 14 is configured as follows. A first end of the resistor R22 is connected to the output terminal of the operational amplifier AMP2. A second end of the resistor R22 is connected to a first end of the resistor R23(1). A second end of the resistor R23(k) (where k=1, 2, . . . , n−1) is connected to a first end of the resistor R23(k+1). A second end of the resistor R23(n) is connected to a first end of the resistor R21 and to the inverting input terminal (−) of the operational amplifier AMP2. A second end of the resistor R21 is connected to the application terminal of the ground voltage Vss.

The switch array SW2 includes PMOSFETs P2(1) to P2(n) that are connected in parallel with the resistors R23(1) to R23(n) respectively. The PMOSFETs P2(1) to P2(n) are turned ON and OFF individually according to instructions from the decoder DEC2.

The decoder DEC2 turns ON and OFF the PMOSFETs P2(1) to P2(n) included in the switch array SW2 according to the trimming signal Strim. For example, when the PMOSFETs P2(1) to P2(n) are all ON, the constant voltage Vreg is set at its lowest value VregL, which is given by formula (3a) below. On the other hand, when the PMOSFETs P2(1) to P2(n) are all OFF, the constant voltage Vreg is set at its highest value VregH, which is given by formula (3b) below.

$$VregL = \frac{R21 + R22}{R21} \cdot Vref \qquad (3a)$$

$$VregH = \frac{R21 + R22 + R23}{R21} \cdot Vref \qquad (3b)$$

In these formulae, R21 and R22 represent the resistance values of the resistors R21 and R22 respectively; R23 represents the maximum composite resistance value of the resistor array R23 (i.e., the sum of all the resistance values of the resistors R23(1) to R23(n)).

By selectively turning ON a given one or plurality of the PMOSFET P2(1) to P2(n), it is possible to set the constant voltage Vreg at a voltage in the range of VregL<Vreg<VregH.

In this way, in the regulator 30 of the second configuration example, as in the first configuration example, it is possible to adjust the ratio of voltage division by the resistor ladder RL2 (and hence the output gain of the regulator 30) as desired according to the trimming signal Strim. It is thus possible to enhance the precision of the constant voltage Vreg.

In particular, in the regulator 30 of the second configuration example, the resistors R23(1) to R23(n) included in the resistor array R23 can be given mutually different resistance values, and thus can be assigned weights individually. Thus, it is possible to trim the ratio of voltage division by the resistor ladder RL2 as precisely as with the first configuration example described previously with a reduced number of resistors R23(1) to R23(n) and of PMOSFETs P2(1) to P2(n). This is advantageous to reducing the circuit scale of the regulator 30.

However, in the regulator 30 of the second configuration example, a current passes through whichever of the PMOSFETs P2(1) to P2(n) constituting the switch array SW2 is ON, and its ON-state resistance may affect the precision of trimming. This is disadvantageous to enhancing the precision of the constant voltage Vreg.

Figure 15:
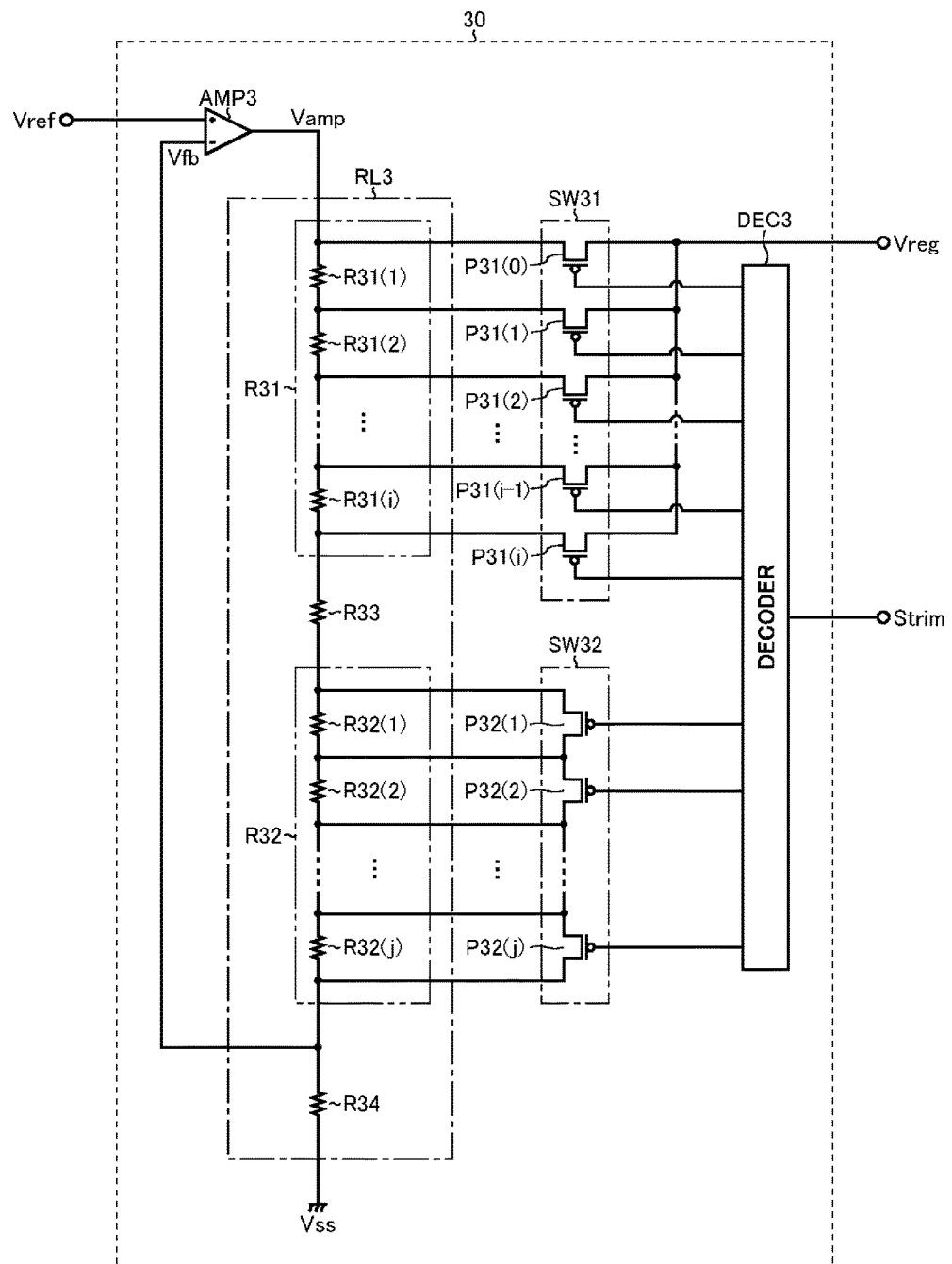
FIG. 15 is a circuit diagram showing a third configuration example of a regulator 30.

Regulator (3rd Configuration Example):

FIG. 15 is a circuit diagram showing a third configuration example of the regulator 30. The regulator 30 of the third configuration example includes an operational amplifier AMP3, a resistor ladder RL3, switch arrays SW31 and SW32, and a decoder DEC3. The decoder DEC3 is fed with a trimming signal Strim, which is read from the non-volatile memory 50.

The operational amplifier AMP3 outputs an amplified voltage Vamp so as to keep equal the feedback voltage Vfb, which is fed to an inverting input terminal (−) of the operational amplifier AMP3, and the reference voltage Vref, which is fed to a non-inverting input terminal (+) of the operational amplifier AMP3.

The resistor ladder RL31 is a resistor voltage division circuit that divides the amplified voltage Vamp to produce the feedback voltage Vfb and the constant voltage Vreg. The resistor ladder RL31 is composed of a resistor array R31 (composed of i resistors R31(1) to R31(i)), a resistor array R32 (composed of j resistors R32(1) to R32(j)), and resistors R33 and R34 that are connected in series between an output terminal of the operational amplifier AMP3 (an application terminal of the amplified voltage Vamp) and the application terminal of the ground voltage Vss.

Described more specifically, the example shown in FIG. 15 is configured as follows. A first end of the resistor R31(1) is connected to the output terminal of the operational amplifier AMP3. A second end of the resistor R31(p) (where p=1, 2, . . . , i−1) is connected to a first end of the resistor R31(p+1). A second end of the resistor R31(i) is connected to a first end of the resistor R33. A second end of the resistor R33 is connected to a first end of the resistor R32(1). A second end of the resistor R32(q) (where q=1, 2, . . . , j−1) is connected to a first end of the resistor R32(q+1). A second end of the resistor R32(j) is connected to a first end of the resistor R34 and to the inverting input terminal (−) of the operational amplifier AMP3. A second end of the resistor R34 is connected to the application terminal of the ground voltage Vss.

The switch array SW31 is a circuit that selects one of the endmost and middle nodes of the resistor array R31 included in the resistor ladder RL3 to connect the selected node to an output terminal of the constant voltage Vreg. The switch array SW31 includes PMOSFETs P31(0) to P31(i). The PMOSFET P31(0) is connected between the first end of the resistor R31(1) (i.e., the output terminal of the operational amplifier AMP3) and the output terminal of the constant voltage Vreg, and is turned ON and OFF according to instructions from the decoder DEC3. The PMOSFETs P31(1) to P31(i) are connected respectively between the second ends of the resistors R31(1) to R31(i) and the output terminal of the constant voltage Vreg, and are turned ON and OFF according to instructions from the decoder DEC3.

The switch array SW32 includes PMOSFETs P32(1) to P32(j) that are connected in parallel with the resistors R32(1) to R32(j) respectively. The PMOSFETs P32(1) to P32(j) are turned ON and OFF individually according to instructions from the decoder DEC3.

The decoder DEC3 turns ON and OFF the PMOSFETs P31(0) to P31(i) included in the switch array SW31 and the PMOSFETs P32(0) to P32(j) included in the switch array SW32 according to the trimming signal Strim. For example, when the PMOSFET P31(i) in the switch array SW31 is selectively ON and the PMOSFETs P32(1) to (j) in the switch array SW32 are all ON, the constant voltage Vreg is set at its lowest value VregL, which is given by formula (4a) below. On the other hand, when the PMOSFET P31(0) in the switch array SW31 is selectively ON and the PMOSFETs P32(1) to (j) in the switch array SW32 are all OFF, the constant voltage Vreg is set at its highest value VregH, which is given by formula (4b) below.

$$VregL = \frac{R33 + R34}{R34} \cdot Vref \quad (4a)$$

$$VregH = \frac{R31 + R32 + R33 + R34}{R34} \quad (4b)$$

In these formulae, R31 represents the maximum composite resistance value of the resistor array R31 (i.e., the sum of all the resistance values of the resistor R31(1) to R31(i)); R32 represents the maximum composite resistance value of the resistor array R32 (i.e., the sum of all the resistance values of the resistor R32(1) to R32(j)); R33 and R34 represent the resistance values of the resistors R33 and R34 respectively.

By properly turning ON and OFF the PMOSFETs P31(0) to P31(i) and the PMOSFETs P32(1) to (j) in different combinations other than those mentioned above, it is possible to set the constant voltage Vreg at a voltage in the range of VregL<Vreg<VregH.

In this way, in the regulator 30 of the third configuration example, as in the first and second configuration examples, it is possible to adjust the ratio of voltage division by the resistor ladder RL3 (and hence the output gain of the regulator 30) as desired according to the trimming signal Strim. It is thus possible to enhance the precision of the constant voltage Vreg.

Here, the resistors R31(1) to R31(i) are designed to have equal resistance values (e.g., less than 5 kΩ). On the other hand, the resistors R32(1) to R32(j) are all given resistance values (e.g., 5 kΩ or more) higher than that of the resistors R32(1) to R32(j), and are assigned weights individually so as to have mutually different resistance values.

With the configuration described above, it is possible to take over the benefits of the first configuration example (FIG. 13) and the second configuration example (FIG. 14) while overcoming their respective shortcomings. Thus, it is possible to enhance the precision of the constant voltage Vreg and simultaneously make the regulator 30 compact.

It is preferable that the device size of the resistors R32(1) to R32(j) be determined appropriately according to the device size of the PMOSFETs P32(1) to P32(j) that are connected in parallel with them. That is, it is preferable that the resistance values of the resistors R32(1) to R32(j) be designed such that the influence of the ON-state resistances of the PMOSFETs P32(1) to P32(j) can be ignored.

More specifically, for the resistors R32(1) to R32(j) with resistance values of 5 kΩ or more, it is preferable to tolerate connecting the PMOSFETs P32(1) to P32(j) in parallel with them to permit their respective resistance values to be assigned weights. This helps make the regulator 30 compact.

On the other hand, for the resistors R31(1) to R31(i) with resistance values of less than 5 kΩ, it is preferable to insert the PMOSFETs P31(1) to P31(i) in a path where no current passes. This helps enhance the precision of trimming.

Figure 16:
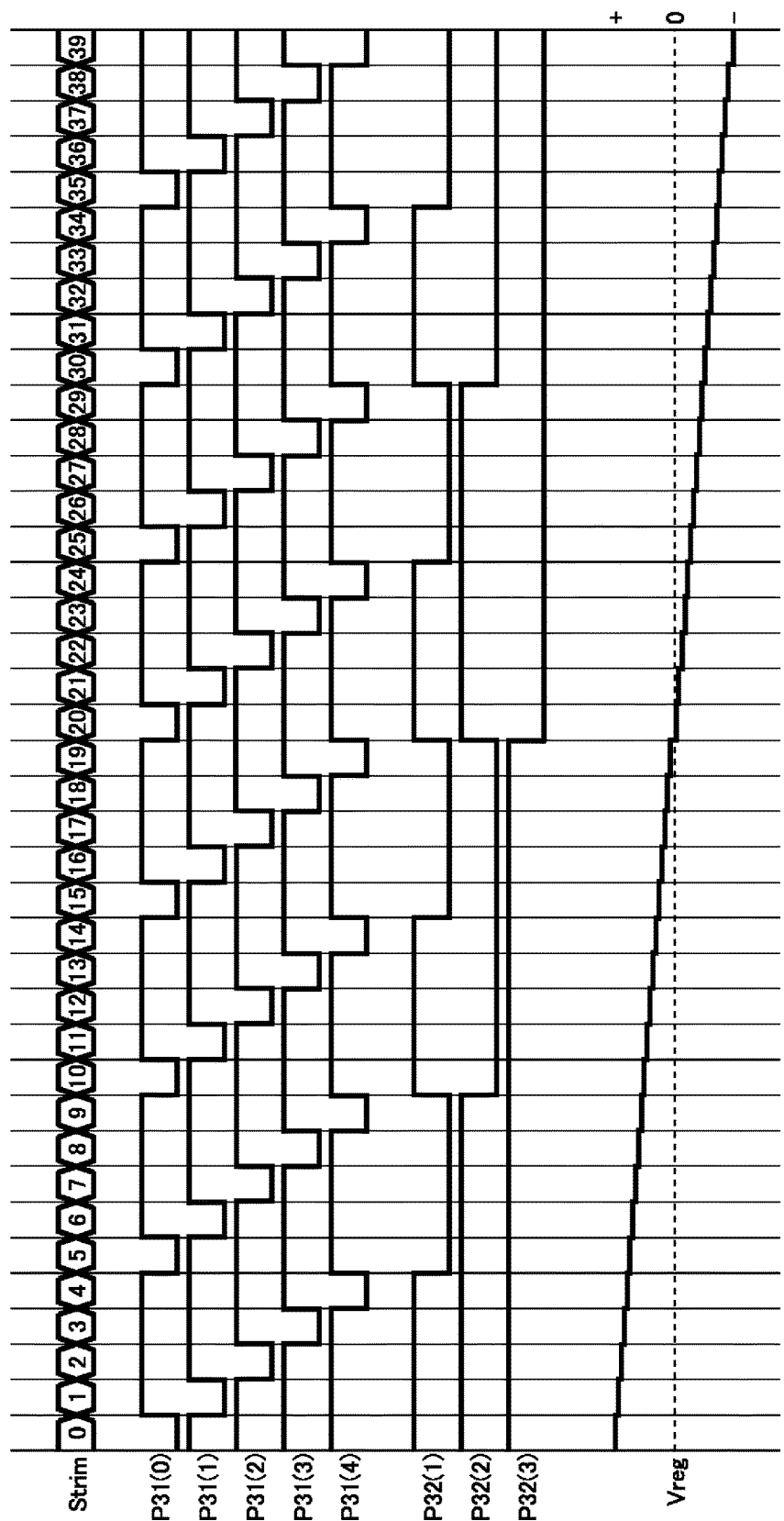
FIG. 16 is a diagram showing trimming operation in the third configuration example.

FIG. 16 is a diagram showing trimming operation in the third configuration example, depicting, from top down, the trimming signal Strim, the gate signals of the PMOSFETs P31(0) to P31(4), the gate signals of the PMOSFETs P32(1) to P32(3), and the constant voltage Vreg. In FIG. 16, for simplicity's sake, the following is assumed: i=4 and j=3; R31(1)=R31(2)=R31(3)=R31(4)=1 kΩ; R32(1)=5 kΩ; R32(2)=10 kΩ; and R32(3)=20 kΩ.

When the data value of the trimming signal Strim is "0", in the switch array SW31, the PMOSFET P31(0) is selectively ON; in the switch array SW32, the PMOSFETs P32(1) to P32(3) are all OFF. As a result the constant voltage Vreg is set at its highest value VregH (=(39 kΩ+R33+R34)/R34× Vref), which is given by formula (4b) noted previously.

As the data value of the trimming signal Strim varies from "1" to "4", in switch array SW31, one after the next of the PMOSFETs P31(1) to P31(4) is selectively turned ON; meanwhile, in the switch array SW32, the PMOSFETs P32(1) to P32(3) are all kept OFF. As a result, due to a voltage drop in the resistor array R31, the constant voltage Vreg is set at a voltage value that is one to four steps lower than its maximum value VregH. The drop in voltage per step equals (1 kΩ/R34)×Vref.

When the data value of the trimming signal Strim is "5", in the switch array SW31, the PMOSFET P31(0) is selectively ON again; in the switch array SW32, the PMOSFET P32(1) is selectively ON. Thus, with the composite resistance value of the resistor array R32 lowered to 30 kΩ, the amplified voltage Vamp is output as the constant voltage Vreg. As a result, the constant voltage Vreg is set at a voltage value (=(34 kΩ+R33+R34)/R34×Vref) that is five steps lower than its maximum value VregH.

As the data value of the trimming signal Strim varies from "6" to "9", in the switch array SW31, one after the next of the PMOSFETs P31(1) to P31(4) is selectively turned ON; meanwhile, in the switch array SW32, only the PMOSFET P32(1) is kept ON. As a result, the constant voltage Vreg is set at a voltage value that is six to nine steps lower than its maximum value VregH.

When the data value of the trimming signal Strim is "10", in the switch array SW31, the PMOSFET P31(0) is selectively ON again; in the switch array SW32, the PMOSFET P32(2) is selectively ON. Thus, with the composite resistance value of the resistor array R32 lowered to 25 kΩ, the amplified voltage Vamp is output as the constant voltage Vreg. As a result, the constant voltage Vreg is set at a voltage value (=(29 kΩ+R33+R34)/R34×Vref) that is ten steps lower than its maximum value VregH.

As the data value of the trimming signal Strim varies from "11" to "14", in the switch array SW31, one after the next of the PMOSFETs P31(1) to P31(4) is selectively turned ON; meanwhile, in the switch array SW32, only the PMOSFET P32(2) is kept ON. As a result, the constant voltage Vreg is set at a voltage value that is 11 to 14 steps lower than its maximum value VregH.

When the data value of the trimming signal Strim is "15", in the switch array SW31, the PMOSFET P31(0) is selectively ON again; in the switch array SW32, the PMOSFETs P32(1) and P32(2) are ON. Thus, with the composite resistance value of the resistor array R32 lowered to 20 kΩ, the amplified voltage Vamp is output as the constant voltage Vreg. As a result, the constant voltage Vreg is set at a voltage value (=(24 kΩ+R33+R34)/R34×Vref) that is 15 steps lower than its maximum value VregH.

As the data value of the trimming signal Strim varies from "16" to "19", in the switch array SW31, one after the next of the PMOSFETs P31(1) to P31(4) is selectively turned ON; meanwhile, in the switch array SW32, the PMOSFETs P32(1) and P32(2) are kept ON. As a result, the constant voltage Vreg is set at a voltage value that is 16 to 19 steps lower than its maximum value VregH.

When the data value of the trimming signal Strim is "20", in the switch array SW31, the PMOSFET P31(0) is selectively ON again; in the switch array SW32, the PMOSFET P32(3) is selectively ON. Thus, with the composite resistance value of the resistor array R32 lowered to 15 kΩ, the amplified voltage Vamp is output as the constant voltage Vreg. As a result, the constant voltage Vreg is set at a voltage value (=(19 kΩ+R33+R34)/R34×Vref) that is 20 steps lower than its maximum value VregH.

As the data value of the trimming signal Strim varies from "21" to "24", in the switch array SW31, one after the next of the PMOSFETs P31(1) to P31(4) is selectively turned ON; meanwhile, in the switch array SW32, only the PMOSFET P32(3) is kept ON. As a result, the constant voltage Vreg is set at a voltage value that is 21 to 24 steps lower than its maximum value VregH.

When the data value of the trimming signal Strim is "25", in the switch array SW31, the PMOSFET P31(0) is selectively ON again; in the switch array SW32, the PMOSFETs P32(1) and P32(3) are ON. Thus, with the composite resistance value of the resistor array R32 lowered to 10 kΩ, the amplified voltage Vamp is output as the constant voltage Vreg. As a result, the constant voltage Vreg is set at a voltage value (=(14 kΩ+R33+R34)/R34×Vref) that is 25 steps lower than its maximum value VregH.

As the data value of the trimming signal Strim varies from "26" to "29", in the switch array SW31, one after the next of the PMOSFETs P31(1) to P31(4) is selectively turned ON; meanwhile, in the switch array SW32, the PMOSFETs P32(1) and P32(3) are kept ON. As a result, the constant voltage Vreg is set at a voltage value that is 26 to 29 steps lower than its maximum value VregH.

When the data value of the trimming signal Strim is "30", in the switch array SW31, the PMOSFET P31(0) is selectively ON again; in the switch array SW32, the PMOSFETs P32(2) and P32(3) are ON. Thus, with the composite resistance value of the resistor array R32 lowered to 5 kΩ, the amplified voltage Vamp is output as the constant voltage Vreg. As a result, the constant voltage Vreg is set at a voltage value (=(9 kΩ+R33+R34)/R34×Vref) that is 30 steps lower than its maximum value VregH.

As the data value of the trimming signal Strim varies from "31" to "34", in the switch array SW31, one after the next of the PMOSFETs P31(1) to P31(4) is selectively turned ON; meanwhile, in the switch array SW32, the PMOSFETs P32(2) and P32(3) are kept ON. As a result, the constant voltage Vreg is set at a voltage value that is 31 to 34 steps lower than its maximum value VregH.

When the data value of the trimming signal Strim is "35", in the switch array SW31, the PMOSFET P31(0) is selectively ON again; in the switch array SW32, the PMOSFETs P32(1) to P32(3) are all ON. Thus, with the resistor array R32 short-circuited, the amplified voltage Vamp is output as the constant voltage Vreg. As a result, the constant voltage Vreg is set at a voltage value (=(4 kΩ+R33+R34)/R34×Vref) that is 35 steps lower than its maximum value VregH.

As the data value of the trimming signal Strim varies from "36" to "39", in the switch array SW31, one after the next of the PMOSFETs P31(1) to P31(4) is selectively turned ON; meanwhile, in the switch array SW32, the PMOSFETs P32(1) to P32(3) are all kept ON. As a result, the constant voltage Vreg is set at a voltage value that is 36 to 39 steps lower than its maximum value VregH. In particular, when the data value of the trimming signal Strim is "39", the constant voltage Vreg is set at its lowest voltage VregL (=(R33+R34)/R34×Vref), which is given by formula (4a) noted previously.

For example, in a case where "20" is taken as the reference data value (with an offset of 0) of the trimming signal Strim, giving the trimming signal Strim a data value smaller than "20" results in giving the constant voltage Vreg a positive offset; by contrast, giving the trimming signal Strim a data value larger than "20" results in giving the constant voltage Vreg a negative offset.

Modifications:

Various technical features disclosed herein can be implemented in any manner other than specifically described by way of embodiments above, and allow for many modifications within the spirit of the technical ingenuity involved. For example, bipolar transistors and MOS field-effect transistors are mutually interchangeable, and the logic levels of any of the various signals can be inverted. That is, it should be understood that the embodiments disclosed herein are in every aspect illustrative and not restrictive, and that the technical scope of the present invention is defined not by the description of embodiments given above but by the scope of the appended claims and encompasses any modification in the sense and scope equivalent to those of the claims.

INDUSTRIAL APPLICABILITY

The invention disclosed herein contributes to, for example, enhancing the precision of voltage reference ICs.

What is claimed is:
1. A reference voltage generation circuit, comprising:
an amplifier;
a first resistor connected between an output terminal of the amplifier and a first input terminal of the amplifier;
a second resistor connected between the output terminal of the amplifier and a second input terminal of the amplifier;
a third resistor connected between the second input terminal of the amplifier and a ground terminal;
a first diode connected between the first input terminal of the amplifier and the ground terminal; and a plurality of second diodes connected in parallel with each other between the second input terminal of the amplifier and the ground terminal,
wherein one of the first and second resistors includes:
  a first resistor portion;
  a second resistor portion having a temperature response different from a temperature response of the first resistor portion, and
  a first trimming portion that adjusts resistance values of the first and second resistor portions while keeping a composite resistance value thereof constant,
  wherein:
    the second resistor portion includes:
      a first resistor element having a first resistance value; and
      a second resistor element having a second resistance value different from the first resistance value,
    the first resistor portion includes:
      a third resistor element having the first resistance value; and
      a fourth resistor element having the second resistance value, and
    the first trimming portion includes:
      a first transistor connected in parallel with the first resistor element;
      a second transistor connected in parallel with the second resistor element;
      a third transistor connected in parallel with the third resistor element; and
      a fourth transistor connected in parallel with the fourth resistor element,
      wherein, when the first and fourth transistors are ON, the second and third transistors are OFF, and when the first and fourth transistors are OFF the second and third transistors are ON.

2. The reference voltage generation circuit of claim 1, wherein the first resistor portion further includes a fifth resistor element having a third resistance value.

3. The reference voltage generation circuit of claim 1, wherein
the other one of the first and second resistors includes:
  a third resistor portion and a fourth resistor portion each having a temperature response identical with the temperature response of the first resistor portion; and
  a second trimming portion that adjusts resistance values of the third and fourth resistor portions while keeping a composite resistance value thereof constant.

4. The reference voltage generation circuit of claim 3, wherein
the third resistor portion includes:
  a sixth resistor element having the first resistance value; and
  a seventh resistor element having the second resistance value,
the fourth resistor portion includes:
  an eighth resistor element having the first resistance value; and
  a ninth resistor element having the second resistance value,
the second trimming portion includes:
  a fifth transistor connected in parallel with the sixth resistor element;
  a sixth transistor connected in parallel with the seventh resistor element;
  a seventh transistor connected in parallel with the eighth resistor element; and
  an eighth transistor connected in parallel with the ninth resistor element,
when the fifth and eighth transistors are ON, the sixth and seventh transistors are OFF, and
when the fifth and eighth transistors are OFF, the sixth and seventh transistors are ON.

5. The reference voltage generation circuit of claim 4, wherein the fourth resistor portion further includes a tenth resistor element having a third resistance value.

6. A reference voltage generation circuit, comprising:
an amplifier;
a first resistor connected between an output terminal of the amplifier and a first input terminal of the amplifier;
a second resistor connected between the output terminal of the amplifier and a second input terminal of the amplifier;
a third resistor connected between the second input terminal of the amplifier and a ground terminal;
a first diode connected between the first input terminal of the amplifier and the ground terminal; and
a plurality of second diodes connected in parallel with each other between the second input terminal of the amplifier and the ground terminal,
wherein one of the first and second resistors includes:
  a first resistor portion;
    a second resistor portion having a temperature response different from a temperature response of the first resistor portion, and
  a first trimming portion that adjusts resistance values, respectively, of the first and second resistor portions while keeping a composite resistance value thereof constant,
and wherein the other one of the first and second resistors includes:
  a third resistor portion having a temperature response identical with the temperature response of the first resistor portion, wherein the third resistor portion includes:
    a sixth resistor element having a first resistance value; and
    a seventh resistor element having a second resistance value;
  a fourth resistor portion having a temperature response identical with the temperature response of the first resistor portion, wherein the fourth resistor portion includes:
    an eighth resistor element having the first resistance value; and
    a ninth resistor element having the second resistance value; and
  a second trimming portion that adjusts resistance values of the third and fourth resistor portions while keeping a composite resistance value thereof constant,
  wherein the second trimming portion includes:
    a fifth transistor connected in parallel with the sixth resistor element;
    a sixth transistor connected in parallel with the seventh resistor element;
    a seventh transistor connected in parallel with the eighth resistor element; and
    an eighth transistor connected in parallel with the ninth resistor element, wherein when the fifth and eighth transistors are ON, the sixth and seventh transistors are OFF, and when the fifth and eighth transistors are OFF, the sixth and seventh transistors are ON.

* * * * *